US012211717B2

United States Patent
Ng et al.

(10) Patent No.: US 12,211,717 B2
(45) Date of Patent: Jan. 28, 2025

(54) SPATIAL PATTERN LOADING MEASUREMENT WITH IMAGING METROLOGY

(71) Applicant: Applied Materials, Inc., Santa Clara, CA (US)

(72) Inventors: Eric Chin Hong Ng, Milpitas, CA (US); Edward Wibowo Budiarto, Fremont, CA (US); Mehdi Vaez-Iravani, Los Gatos, CA (US); Todd Jonathan Egan, Fremont, CA (US); Venkatakaushik Voleti, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 547 days.

(21) Appl. No.: 17/216,203

(22) Filed: Mar. 29, 2021

(65) Prior Publication Data

US 2022/0310425 A1    Sep. 29, 2022

(51) Int. Cl.
*H01L 21/67* (2006.01)
*G01B 11/06* (2006.01)
*G06N 5/04* (2023.01)
*G06N 20/00* (2019.01)

(52) U.S. Cl.
CPC ........ *H01L 21/67253* (2013.01); *G01B 11/06* (2013.01); *G06N 5/04* (2013.01); *G06N 20/00* (2019.01); *G01B 2210/56* (2013.01)

(58) Field of Classification Search
CPC .... H01L 21/67253; G06N 20/00; G06N 5/04; G01B 11/06
See application file for complete search history.

(56) References Cited

U.S. PATENT DOCUMENTS

| 6,410,351 | B1 | 6/2002 | Christopher |
| 2003/0049390 | A1 | 3/2003 | Arulkumar |
| 2019/0244139 | A1* | 8/2019 | Varadarajan ........... G06N 20/10 |

(Continued)

FOREIGN PATENT DOCUMENTS

| KR | 1020090127681 A | 12/2009 |
| KR | 1020200072302 A | 6/2020 |

OTHER PUBLICATIONS

Mackus, A.J., Merkx, M.J. and Kessels, W.M., 2018. From the bottom-up: toward area-selective atomic layer deposition with high selectivity. Chemistry of Materials, 31(1), pp. 2-12.

(Continued)

*Primary Examiner* — Bradley Smith
(74) *Attorney, Agent, or Firm* — Lowenstein Sandler LLP

(57) ABSTRACT

A method includes identifying first structure data of a first region of a substrate and receiving optical metrology data of the substrate associated with one or more substrate deposition processes in a processing chamber. The method further includes determining, based on the optical metrology data and the first structure data, a first growth rate of the first region of the substrate associated with the one or more substrate deposition processes. The method further includes predicting, based on the optical metrology data and the first growth rate, thickness data of a second region of the substrate without second structure data of the second region.

20 Claims, 9 Drawing Sheets

(56) References Cited

U.S. PATENT DOCUMENTS

2020/0227294 A1    7/2020  Zhu et al.

OTHER PUBLICATIONS

Knoops, H.C.M., Langereis, E., Van De Sanden, M.C.M. and Kessels, W.M.M., 2010. Conformality of plasma-assisted ALD: physical processes and modeling. Journal of the Electrochemical Society, 157(12), p. G241.
Puurunen, R.L. and Vandervorst, W., 2004. Island growth as a growth mode in atomic layer deposition: A phenomenological model. Journal of Applied Physics, 96(12), pp. 7686-7695.
Baji, Z., Labadi, Z., Horvath, Z.E., Molnar, G., Volk, J., Barsony, I. and Bama, P., 2012. Nucleation and growth modes of ALD ZnO. Crystal growth & design, 12(11), pp. 5615-5620.
Cremers, V., Puurunen, R.L. and Dendooven, J., 2019. Conformality in atomic layer deposition: Current status overview of analysis and modelling. Applied Physics Reviews, 6(2), p. 021302.
International Search Report for PCT Application No. PCT/US2022/022187 dated Jul. 15, 2022.

* cited by examiner

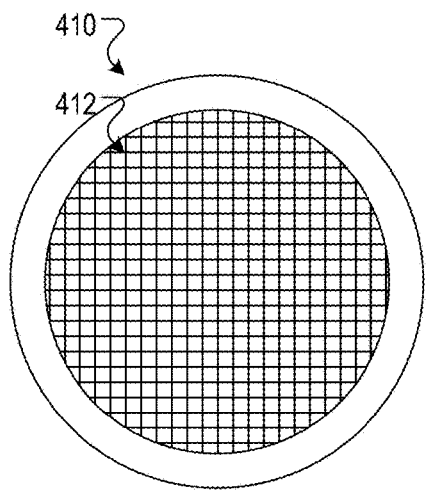
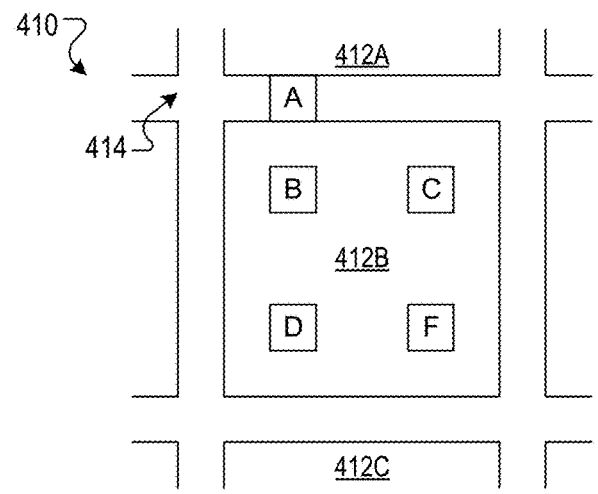
FIG. 4A  FIG. 4B
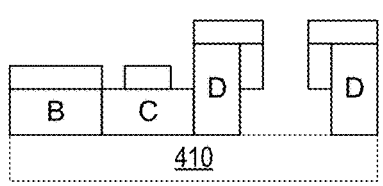
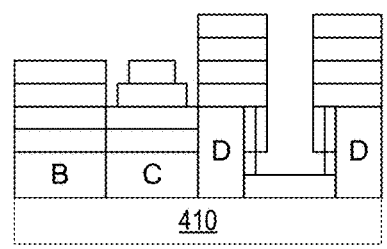
FIG. 4C  FIG. 4D
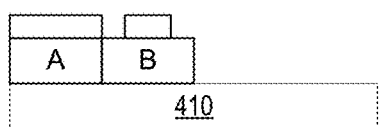
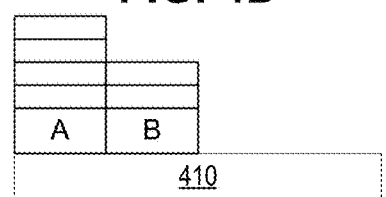
FIG. 4E  FIG. 4F
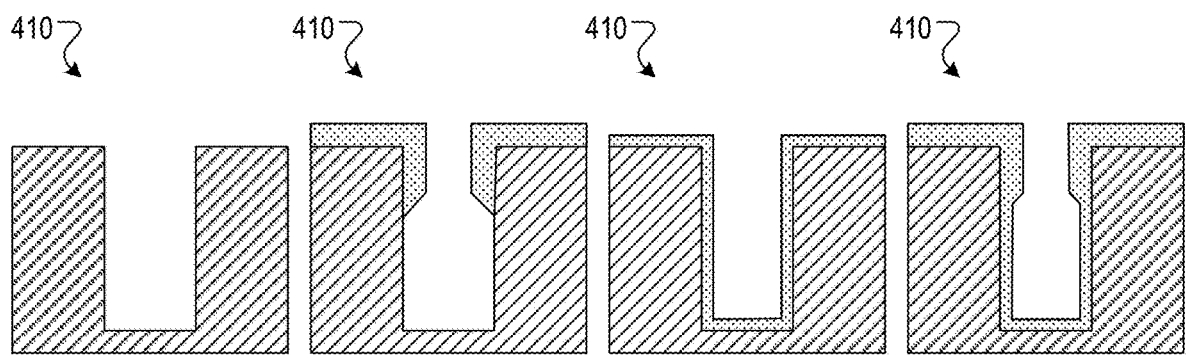
FIG. 4G  FIG. 4H  FIG. 4I  FIG. 4J

SPATIAL PATTERN LOADING MEASUREMENT WITH IMAGING METROLOGY

TECHNICAL FIELD

The present disclosure relates to performing measurements, and, more particularly, spatial pattern loading measurements.

BACKGROUND

Substrates are processed via substrate processing equipment. Some substrates undergo substrate deposition processes where layers of material are added on the substrates.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, a method includes identifying first structure data of a first region of a substrate and receiving optical metrology data of the substrate associated with one or more substrate deposition processes in a processing chamber. The method further includes determining, based on the optical metrology data and the first structure data, a first growth rate of the first region of the substrate associated with the one or more substrate deposition processes. The method further includes predicting, based on the optical metrology data and the first growth rate, thickness data of a second region of the substrate without second structure data of the second region.

In an aspect of the disclosure, a system includes a memory and a processing device coupled to the memory. The processing device is to identify first structure data of a first region of a substrate and receive optical metrology data of the substrate associated with one or more substrate deposition processes in a processing chamber. The processing device is further to determine, based on the optical metrology data and the first structure data, a first growth rate of the first region of the substrate associated with the one or more substrate deposition processes. The processing device is further to predict, based on the optical metrology data and the first growth rate, thickness data of a second region of the substrate without second structure data of the second region.

In an aspect of the disclosure, a non-transitory computer readable medium having instructions stored thereon, which, when executed by a processing device, cause the processing device to perform operations including identifying first structure data of a first region of a substrate and receiving optical metrology data of the substrate associated with one or more substrate deposition processes in a processing chamber. The operations further include determining, based on the optical metrology data and the first structure data, a first growth rate of the first region of the substrate associated with the one or more substrate deposition processes. The operations further include predicting, based on the optical metrology data and the first growth rate, thickness data of a second region of the substrate without second structure data of the second region.

BRIEF DESCRIPTION OF THE DRAWINGS

The present disclosure is illustrated by way of example, and not by way of limitation in the figures of the accompanying drawings.

FIGS. 4A-J illustrate substrates associated with spatial pattern loading measurements, according to certain embodiments.

DETAILED DESCRIPTION

Figure 1:
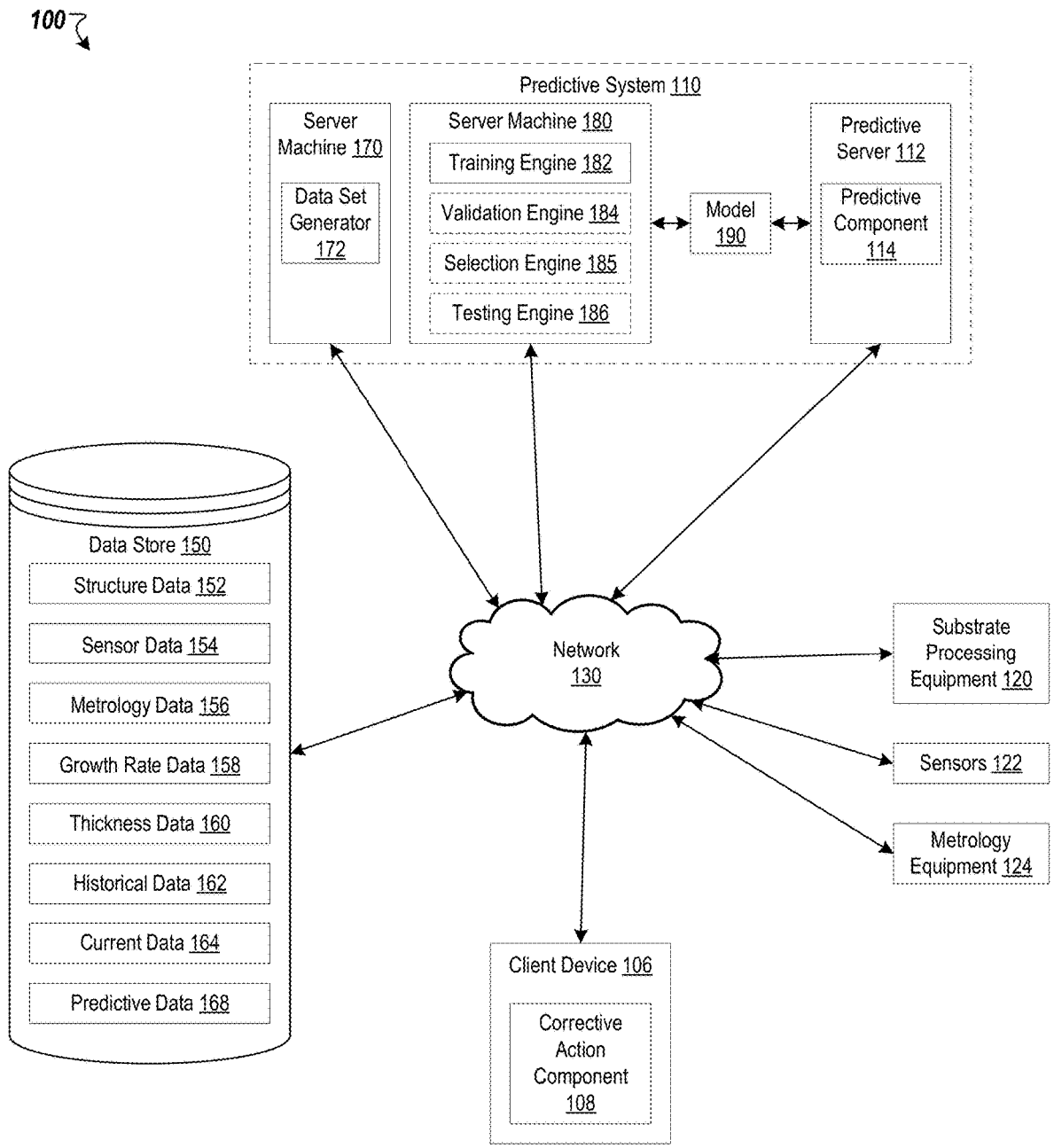
FIG. 1 is a block diagram illustrating an exemplary system architecture, according to certain embodiments.

Described herein are technologies directed to spatial pattern loading measurements with imaging metrology (e.g., by identification of growth regime).

Substrates are processed using substrate processing equipment. A substrate may undergo substrate deposition processes in a processing chamber. Different regions of a substrate may have different physical and/or chemical features. In a substrate deposition process, a substrate may first undergo a nucleation phase (e.g., nucleation regime) and then a growth phase (e.g., growth regime). In the nucleation phase, one or more materials are added onto layers made of different materials on a substrate. Once an atomic layer is fully grown over the underlying layer in the nucleation phase, the growth phase includes addition of materials onto layers of similar materials. Some regions of a substrate (e.g., that have different aspect ratios, that have different physical and/or chemical features) begin the growth phase at different times. This causes different thicknesses of materials to be deposited on different regions of the substrate which can cause non-uniformity of substrates, malfunctioning substrates, decreased performance, and/or the like.

To determine non-uniformity of layers on substrates, substrates are to be measured. A substrate may undergo hundreds of substrate deposition processes. Conventionally, measurements are performed periodically. Underlying structures of the substrate may be unknown or undisclosed. One conventional solution to perform a destructive metrology to perform measurements which causes the substrate to be unusable. Another conventional solution is to estimate that all other regions on a substrate are the same as a reference region where the underlying structure is known. This may generate erroneous estimated measurements (e.g., due to different physical features and/or chemical features of different regions).

The systems and methods disclosed herein are associated with spatial pattern loading measurements with imaging metrology (e.g., by identification of growth regime).

First structure data (e.g., underlying structure) of a first region of a substrate is identified. The first region may be a metrology pad (e.g., non-functioning portion of the substrate). Optical metrology data (e.g., reflectometry data) of the substrate associated with substrate deposition processes in a processing chamber is received. The optical metrology data may be received for multiple regions of the substrate at multiple points in time (e.g., before, during, and/or after one or more substrate deposition processes). Based on the optical metrology data (e.g., of the first region) and the first structure data (e.g., underlying structure), a first growth rate of the first region of the substrate associated with the substrate deposition processes is determined. The growth rate may include an increase in thickness of one or more layers over time due to the substrate deposition processes.

Thickness data of a second region of the substrate (e.g., where structure data of the second region is unknown) is predicted based on the optical metrology data (e.g., of the second region) and the first growth rate. The thickness data may be indicative of one or more of onset of the growth regime of the substrate deposition processes on the second region; a thickness difference between the first region and the second region; a deposited thickness on the second region; and/or the like.

In some embodiments, measured data of the second region prior to the substrate deposition processes is determined. Estimated thickness data of the second region is determined. The estimated thickness data is extrapolated to a previous point in time (e.g., before the substrate deposition processes). Offset data is determined based on a difference between the expected data and the measured data of the previous point in time. The offset data may be indicative of a delay of onset of the growth regime in the second region. The offset data may be used to predict the thickness data of the second region (e.g., even when underlying structure data of the second data is unknown).

The predicting of the thickness data may be performed with one or more of a polynomial fit, an empirical model, a trained machine learning model, and/or the like.

The thickness data may be used to cause a corrective action associated with the substrate deposition processes in the processing chamber. In some examples, responsive to determining that the thickness data of the second region is different from thickness data of a third region (e.g., delay in onset of the growth regime), substrate deposition processes are controlled to provide uniformity (e.g., substrate deposition processes are performed for the second region without performing substrate deposition processes for the third region). In some examples, responsive to determining the thickness data of the second region is different from thickness data of another region (e.g., difference in thickness exceeds a threshold value), the substrate may be discarded and a corrective action may occur (e.g., update the design of the substrate, update the manufacturing parameters, update the substrate deposition processes, etc.). In some examples, an alert may be provided based on the thickness data of the second region.

Aspects of the present disclosure result in technological advantages compared to conventional solutions. The present disclosure may provide thickness data without constantly collecting metrology data which saves on time, energy, bandwidth, processor overhead, storage, etc. The present disclosure may provide thickness data in a non-destructive manner (e.g., the substrate is still usable after providing thickness data) compared to some conventional that use destructive metrology. The present disclosure may provide thickness data for regions where the underlying structure is unknown compared to conventional solutions that provide erroneous estimated thickness data based on assuming that all regions are the same. The present disclosure allows for performing corrective actions to have better substrates, better substrate deposition processes, better manufacturing parameters, less discarded substrates, and/or the like compared to conventional solutions.

FIG. 1 is a block diagram illustrating an exemplary system architecture of system 100, according to certain embodiments. The system 100 includes a client device 106, substrate processing equipment 120, sensors 122, metrology equipment 124, a predictive server 112, and a data store 150. The predictive server 112 may be part of a predictive system 110. The predictive system 110 may further include server machines 170 and 180.

The substrate processing equipment 120 may include a processing chamber.

Sensors 122 may provide sensor data 154 (e.g., manufacturing parameters of substrate processing equipment 120, etc.) associated with a substrate produced by the substrate processing equipment 120. The sensor data 154 may include a value of one or more of temperature (e.g., heater temperature), spacing (SP), pressure, high frequency radio frequency (HFRF), voltage of electrostatic chuck (ESC), electrical current, flow, power, voltage, etc. Sensor data 154 may be associated with or indicative of manufacturing parameters such as hardware parameters (e.g., settings or components (e.g., size, type, etc.) of the substrate processing equipment 120) or process parameters of the substrate processing equipment 120. The sensor data 154 may be provided while the substrate processing equipment 120 is performing substrate processing operations (e.g., equipment readings when processing substrates). The sensor data 154 may be different for each product (e.g., each substrate).

Metrology equipment 124 may provide metrology data 156 (e.g., measurements, material properties, storage information, environmental conditions, etc.) of a substrate produced by the substrate processing equipment 120. The metrology equipment 124 may provide metrology data 156 (e.g., property data of substrates) associated with substrates before, during, and/or after being processed by the substrate processing equipment 120. The metrology data 156 may include a value of one or more of film property data (e.g., wafer spatial film properties), dimensions (e.g., thickness, height, etc.), dielectric constant, dopant concentration, density, defects, etc. The metrology data 156 may be of a finished or semi-finished product. The metrology data 156 may be different for each product (e.g., each substrate).

The data integration server 102, client device 106, substrate processing equipment 120, sensors 122, metrology equipment 124, predictive server 112, data store 150, server machine 170, and server machine 180 may be coupled to each other via a network 130 for determining predictive data 168 to perform corrective actions. In some embodiments, network 130 is a public network that provides client device 106 with access to the predictive server 112, data store 150, and other publically available computing devices. In some embodiments, network 130 is a private network that provides data integration server 102 access to the data store 150 and other privately available computing devices and that provides client device 106 access to the predictive server 112, data store 150, and other privately available computing devices. Network 130 may include one or more wide area networks (WANs), local area networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

The client device 106 may include a computing device such as a personal computer (PC), desktop computer, laptop, mobile phone, smart phone, tablet computer, netbook computer, etc. The client device 106 may include a corrective action component 108. Corrective action component 108 may receive user input (e.g., via a graphic user interface (GUI) displayed via the client device 106) of an indication associated with a substrate and/or substrate processing equipment 120 associated with the substrate. In some embodiments, the corrective action component 108 transmits the indication to the predictive system 110, receives output (e.g., predictive data 168) from the predictive system 110, determines a corrective action based on the output, and causes the corrective action to be implemented. Client device 106 may include an operating system that allows users to one or more of generate, view, or edit data (e.g., indication associated with substrate processing equipment 120, substrate, corrective actions, etc.).

Corrective actions may be associated with one or more of updating substrate deposition processes, updating substrate design, computational process control (CPC), statistical process control (SPC), automatic process control (APC), preventative operative maintenance, design optimization, updating of manufacturing parameters, feedback control, machine learning modification, etc.

In some embodiments, the corrective action includes providing an alert (e.g., an alarm to stop or not perform the manufacturing process if the predictive data 168 indicates the product is to have poor performance, such as a surface of the product is predicted to not be uniform). In some embodiments, the corrective action is providing feedback control (e.g., modifying a manufacturing parameter, such as adjusting substrate deposition processes based on predictive data 168 indicative of a delay in onset of the growth phase of a region of the substrate). In some embodiments, the corrective action is providing machine learning (e.g., modifying one or more substrate deposition processes, manufacturing parameters, etc. based on the predictive data 168).

In some embodiments, the corrective action includes causing updates to one or more manufacturing parameters. Manufacturing parameters may include hardware parameters (e.g., replacing components, using certain components, etc.) and/or process parameters (e.g., temperature, pressure, flow, rate, etc.). In some embodiments, the corrective action is causing preventative operative maintenance (e.g., replace, process, clean, etc. components of the substrate processing equipment 120). In some embodiments, the corrective action is causing design optimization (e.g., updating manufacturing parameters, manufacturing processes, part design, substrate processing equipment 120, etc. for an optimized product).

The predictive server 112, server machine 170, and server machine 180 may each include one or more computing devices such as a rackmount server, a router computer, a server computer, a PC, a mainframe computer, a laptop computer, a tablet computer, a desktop computer, graphics processing unit (GPU), accelerator application-specific integrated circuit (ASIC) (e.g., tensor processing unit (TPU)), etc.

The predictive server 112 may include a predictive component 114. In some embodiments, the predictive component 114 may retrieve current data 164 (e.g., structure data 152, sensor data 154, metrology data 156, etc.) from the data store and generate output (e.g., predictive data 168) for performing a corrective action associated with a substrate and/or substrate processing equipment 120. In some embodiments, the predictive component 114 may use a model 190 (e.g., polynomial fit, empirical model, trained machine learning model, etc.) to determine the output for performing the corrective action. The model 190 may be trained using the historical data 162 (e.g., structure data 152, sensor data 154, metrology data 156, etc.) to learn key process, product, and/or hardware parameters. Generating, by the trained model 190, output for performing corrective action may include prescribing, by the trained model 190, optimal substrate deposition processes, operating conditions (e.g., process parameters) and/or space (e.g., hardware parameters). In some embodiments, the predictive component 114 determines predictive data 168 for performing corrective action by providing current data 164 (e.g., structure data 152, sensor data 154, metrology data 156, etc.) into the trained model 190, obtaining output from the trained model 190, and determining predictive data 168 based on the output.

Data store 150 may be memory (e.g., random access memory), a drive (e.g., a hard drive, a flash drive), a database system, or another type of component or device capable of storing data. Data store 150 may include multiple storage components (e.g., multiple drives or multiple databases) that may span multiple computing devices (e.g., multiple server computers). The data store 150 may store structure data 152, sensor data 154, metrology data 156, growth rate data 158, thickness data 160, historical data 162, current data 164, and/or predictive data 168. The historical data 162 (e.g., structure data 152, sensor data 154, metrology data 156, etc.) may be used to train a model 190. The current data 164 may be data (e.g., structure data 152, sensor data 154, metrology data 156, etc.) for which predictive data 168 is to be generated (e.g., for performing corrective actions).

Each instance (e.g., set) of structure data 152, sensor data 154, and/or metrology data 156 may correspond to corresponding substrate processing equipment 120, a corresponding timestamp, a corresponding product (e.g., substrate), and/or a corresponding region of the product.

In some embodiments, the client device 106 may store historical data 162 (e.g., structure data 152, sensor data 154, metrology data 156, etc.) and/or current data 164 (e.g., structure data 152, sensor data 154, metrology data 156, etc.) in the data store 150 and the predictive server 112 may retrieve the historical data 162 and/or current data 164 from the data store 150. In some embodiments, the predictive server 112 may store output (e.g., predictive data 168) of the trained model 190 in the data store 150 and the client device 106 may retrieve the output from the data store 150.

In some embodiments, predictive system 110 further includes server machine 170 and server machine 180. Server machine 170 includes a data set generator 172 that is capable of generating data sets (e.g., a set of data inputs, a set of data inputs and a set of target outputs) to train, validate, and/or test a model 190. Some operations of data set generator 172 are described in detail below with respect to FIGS. 6A and 7A. In some embodiments, the data set generator 172 may partition the historical data 162 into a training set (e.g., sixty percent of the historical data 162), a validating set (e.g., twenty percent of the historical data 162), and a testing set (e.g., twenty percent of the historical data 162). In some embodiments, the predictive system 110 (e.g., via predictive component 114) generates multiple sets of features. For example a first set of features may be a first set of data (e.g., associated with a first region of the substrate, from a first set of sensors, etc.) that correspond to each of the data sets (e.g., training set, validation set, and testing set) and a second set of features may be a second set of types of data (e.g., associated with a second region of the substrate, from a second set of sensors different from the first set of sensors, etc.) that correspond to each of the data sets.

Server machine 180 includes a training engine 182, a validation engine 184, selection engine, and/or a testing engine 186. An engine (e.g., training engine 182, a validation engine 184, selection engine 185, and a testing engine 186) may refer to hardware (e.g., circuitry, dedicated logic, programmable logic, microcode, processing device, etc.), software (such as instructions run on a processing device, a general purpose computer system, or a dedicated machine), firmware, microcode, or a combination thereof. The training engine 182 may be capable of training a model 190 using one or more sets of features associated with the training set from data set generator 172. The training engine 182 may generate multiple trained models 190, where each trained model 190 corresponds to a distinct set of features of the training set (e.g., sensor data from a distinct set of sensors). For example, a first trained model may have been trained using all features (e.g., X1-X5), a second trained model may have been trained using a first subset of the features (e.g., X1, X2, X4), and a third trained model may have been trained using a second subset of the features (e.g., X1, X3, X4, and X5) that may partially overlap the first subset of features.

The validation engine 184 may be capable of validating a trained model 190 using a corresponding set of features of the validation set from data set generator 172. For example, a first trained model 190 that was trained using a first set of features of the training set may be validated using the first set of features of the validation set. The validation engine 184 may determine an accuracy of each of the trained models 190 based on the corresponding sets of features of the validation set. The validation engine 184 may discard trained models 190 that have an accuracy that does not meet a threshold accuracy. In some embodiments, the selection engine 185 may be capable of selecting one or more trained models 190 that have an accuracy that meets a threshold accuracy. In some embodiments, the selection engine 185 may be capable of selecting the trained model 190 that has the highest accuracy of the trained models 190.

The testing engine 186 may be capable of testing a trained model 190 using a corresponding set of features of a testing set from data set generator 172. For example, a first trained model 190 that was trained using a first set of features of the training set may be tested using the first set of features of the testing set. The testing engine 186 may determine a trained model 190 that has the highest accuracy of all of the trained models based on the testing sets.

The model 190 may refer to the model artifact that is created by the training engine 182 using a training set that includes data inputs and, in some embodiments, corresponding target outputs (correct answers for respective training inputs). Patterns in the data sets can be found that cluster the data input and/or map the data input to the target output (the correct answer), and the model 190 is provided mappings that captures these patterns. The model 190 may use one or more of machine learning model, polynomial fit, empirical model, unsupervised machine learning model, supervised machine learning model, linear regression, random forest, neural network (e.g., artificial neural network), etc.

Predictive component 114 may provide current data 164 to the trained model 190 and may run the trained model 190 on the input to obtain one or more outputs. The predictive component 114 may be capable of determining (e.g., extracting) predictive data 168 from the output of the trained model 190 and may determine (e.g., extract) confidence data from the output that indicates a level of confidence that the predictive data 168 corresponds to the substrate (e.g., corresponds to the thickness data 160). The predictive component 114 or corrective action component 108 may use the confidence data to decide whether to cause a corrective action associated with the substrate processing equipment 120 based on the predictive data 168.

The confidence data may include or indicate a level of confidence that the predictive data 168 corresponds to the current data 164. In one example, the level of confidence is a real number between 0 and 1 inclusive, where 0 indicates no confidence that the predictive data 168 corresponds to the current data 164 and 1 indicates absolute confidence that the predictive data 168 corresponds to the current data 164. In some embodiments, the system 100 may use predictive system 110 to determine predictive data 168 instead of using the metrology equipment 124 to determine metrology data as often, instead of using destructive metrology equipment, etc. In some embodiments, responsive to the confidence data indicating a level of confidence that is below a threshold level, the system 100 may cause the metrology equipment 124 to generate the metrology data more often. Responsive to the confidence data indicating a level of confidence below a threshold level for a predetermined number of instances (e.g., percentage of instances, frequency of instances, total number of instances, etc.) the predictive component 114 may cause the trained model 190 to be re-trained (e.g., based on the current data 164, etc.).

For purpose of illustration, rather than limitation, aspects of the disclosure describe the training of a model using historical data 162 and inputting current data 164 into the trained model to determine predictive data 168. In other implementations, a heuristic model or rule-based model is used to determine predictive data 168 (e.g., without using a trained model). Predictive component 114 may monitor historical data 162. Any of the information described with respect to data inputs 601 of FIG. 6A may be monitored or otherwise used in the heuristic or rule-based model.

In some embodiments, the functions of client device 106, predictive server 112, server machine 170, and server machine 180 may be provided by a fewer number of machines. For example, in some embodiments server machines 170 and 180 may be integrated into a single machine, while in some other embodiments, server machine 170, server machine 180, and predictive server 112 may be integrated into a single machine. In some embodiments, client device 106 and predictive server 112 may be integrated into a single machine.

In general, functions described in one embodiment as being performed by client device 106, predictive server 112, server machine 170, and server machine 180 can also be performed on predictive server 112 in other embodiments, if appropriate. In addition, the functionality attributed to a particular component can be performed by different or multiple components operating together. For example, in some embodiments, the predictive server 112 may determine the corrective action based on the predictive data. In another example, client device 106 may determine the predictive data 168 based on output from the trained model.

In addition, the functions of a particular component can be performed by different or multiple components operating together. One or more of the predictive server 112, server machine 170, or server machine 180 may be accessed as a service provided to other systems or devices through appropriate application programming interfaces (API).

In embodiments, a "user" may be represented as a single individual. However, other embodiments of the disclosure encompass a "user" being an entity controlled by a plurality of users and/or an automated source. For example, a set of individual users federated as a group of administrators may be considered a "user."

Although embodiments of the disclosure are discussed in terms of generating predictive data 168 to perform a corrective action in manufacturing facilities (e.g., substrate processing facilities), embodiments may also be generally applied to predicting data to perform an action. For example, data (e.g., metrology data) may be collected for predicting end of life of components. In another example, images may be aggregated with corresponding image classification for predicting image classification of images.

Figure 2A:
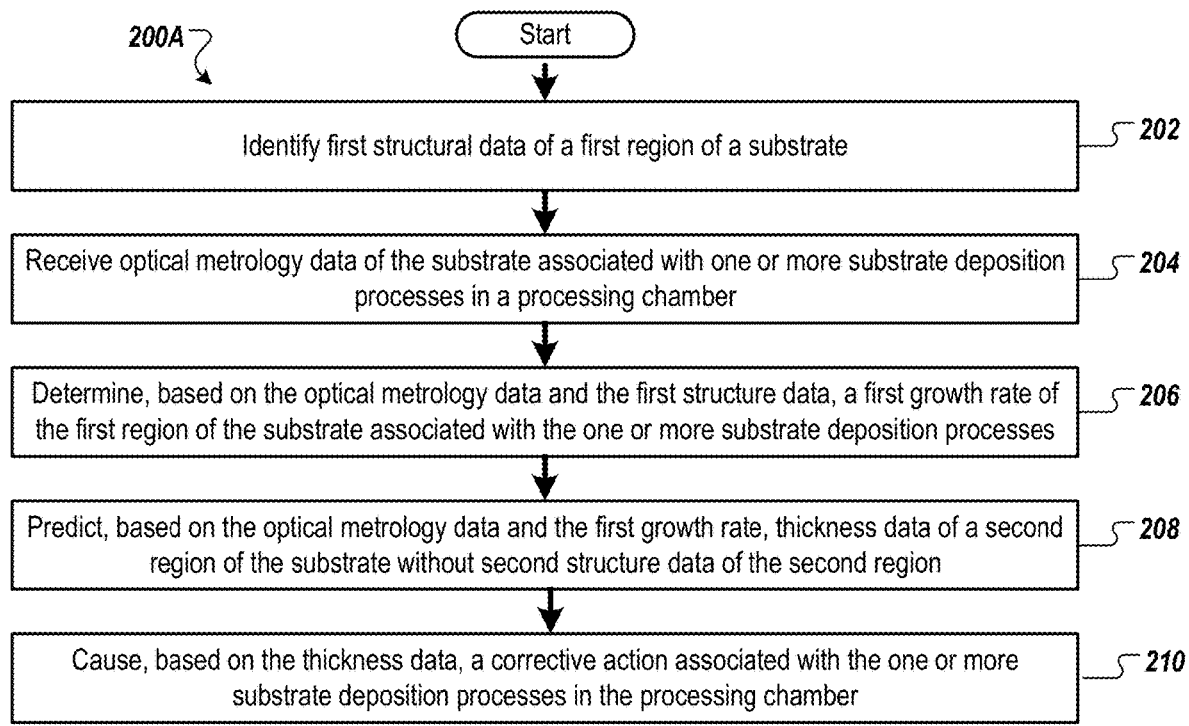
FIGS. 2A-B are flow diagrams associated with spatial pattern loading measurements, according to certain embodiments.
Figure 2B:
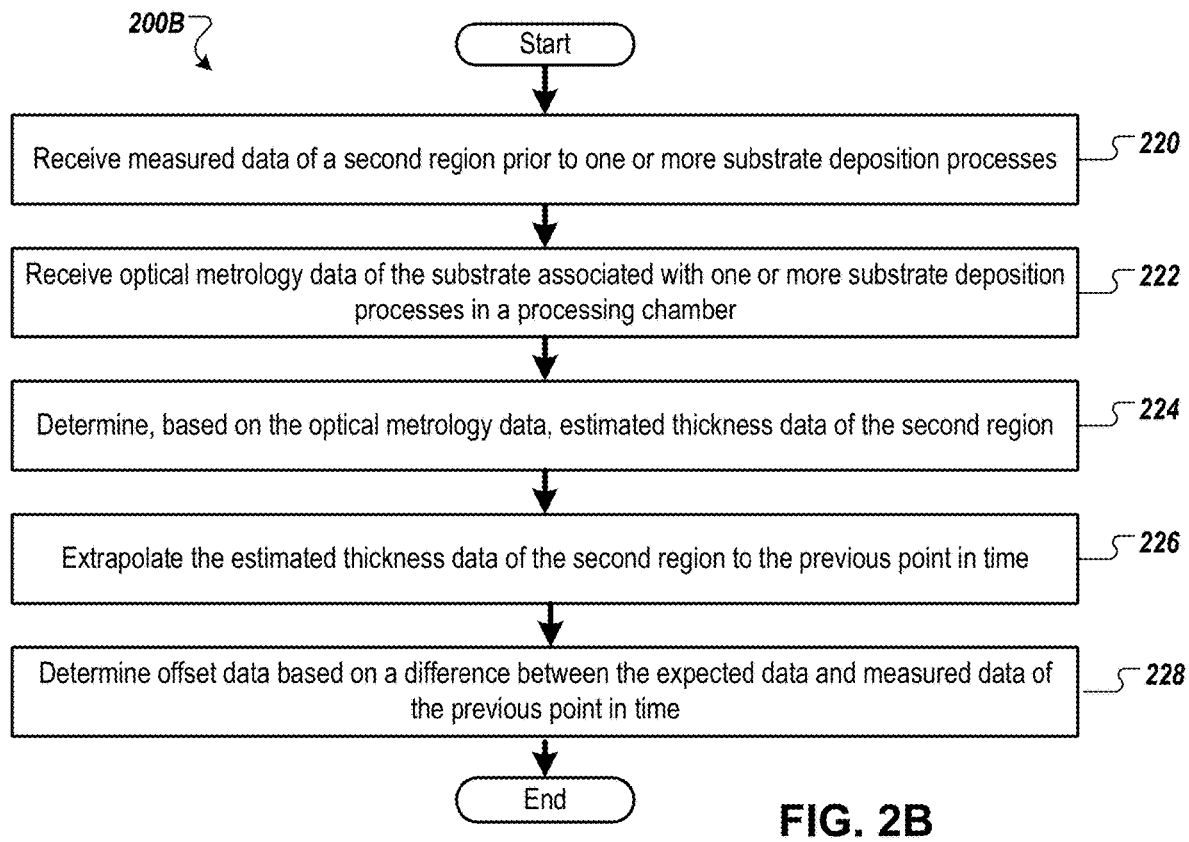

FIGS. 2A-B are flow diagrams of methods 200A-B associated with spatial pattern loading measurements, according to certain embodiments. Methods 200A-B may be performed by processing logic that may include hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiments, methods 200A-B may be performed, in part, by client device 106 (e.g., corrective action component 108) or predictive server 112 (e.g., predictive component 114). In some embodiments, a non-transitory storage medium stores instructions that when executed by a processing device (e.g., of client device 106, of predictive server 112) cause the processing device to perform methods 200A-B.

For simplicity of explanation, methods 200A-B are depicted and described as a series of acts. However, acts in accordance with this disclosure can occur in various orders and/or concurrently and with other acts not presented and described herein. Furthermore, not all illustrated acts may be performed to implement the methods 200A-B in accordance with the disclosed subject matter. In addition, those skilled in the art will understand and appreciate that the methods 200A-B could alternatively be represented as a series of interrelated states via a state diagram or events.

Methods 200A-B may be used for in-situ or sequential imaging metrology to identify the onset of growth regime of semiconductor addition processes on regions with minimal knowledge of underlying layers or structures. Methods 200A-B may be used to monitor in-die spatial pattern loading effect (e.g., resulting from substrate deposition processes) by spatially identifying the onset of growth regime on functional device area (e.g., with minimal knowledge of underlying layers or structures at device area). Methods 200A-B may be used for spatial pattern loading measurement with imaging metrology by identification of growth regime. The region-specific onset of the second atomic layer growth may be identified (e.g., at which same material is added onto a layer made of similar materials) which gives the same growth rates regardless of regions. Methods 200A-B may be used to predict spatial signal response vs time for the substrate (e.g., device wafer) with a model trained with observations made at a few growth cycles (or points in time). Methods 200A-B may be used to estimate thickness difference between regions over the substrate (e.g., device wafer) by identifying the predicted onset growth time from a model of signal response vs time. Methods 200A-B may be used to perform pattern loading measurement predictions (e.g., predict deposited thicknesses from semiconductor deposition processes such as atomic layer deposition (ALD), predict spatial thickness variations due to newly deposited materials) on regions with unknown and/or non-disclosed underlying structures (e.g., device region outside of designed metrology pad). Methods 200A-B may be used to predict measurements of successive atomic layer depositions or growths on device area of a substrate.

Referring to FIG. 2A, at block 202, the processing logic identifies first structure data of a first region of a substrate. The first region of the substrate may be a non-functioning region of the substrate (e.g., a metrology pad) or limited device region (e.g., static random-access memory (SRAM) region) where the underlying structure (e.g., first structure data) is known (e.g., see region A on FIG. 4B). In some embodiments, the first structure data is identified based on a reference metrology tool and/or a physical model of the first region (e.g., structure data is inverse-predicted from a physical model and/or regression-fit).

At block 204, the processing logic receives metrology data (e.g., optical metrology data) of the substrate associated with one or more substrate deposition processes in a processing chamber. The metrology data may be associated with light that has reflected from the substrate and is detected by metrology equipment (e.g., see metrology equipment 324 of FIGS. 3A-C). The metrology data may be obtained before, during, and/or after one or more substrate deposition processes. The metrology data may be obtained in-situ (e.g., the substrate is still in the substrate processing equipment, such as in the processing chamber). The metrology data may be obtained for one or more regions (e.g., of the same die region of the substrate) over time.

The metrology data may be provided via in-situ modeling or integrated metrology system (e.g., next to the process chamber) to monitor nucleation regime and growth regime of substrate deposition processes. Deposition may include addition of new materials onto layers made of different materials, kick starting the nucleation regime. Once an atomic layer is fully grown over the underlying layer (e.g., nucleation regime ends), growth regime includes addition of materials onto layers made of similar materials. Regions that have different aspect ratios, growth rates are different.

The metrology data may include one or more of optical metrology data, scatterometry data, reflectometry data, reflectance data, spectroscopic data, ellipsometry data, atomic force microscopy (AFM) data, critical-dimension scanning electron microscope (CD-SEM) data, and/or critical-dimension small angle x-ray scattering (CD-SAXS) data.

At block 206, the processing logic determines, based on the optical metrology data and the first structure data, a first growth rate of the first region of the substrate associated with the one or more substrate deposition processes. The first growth rate may be an increase of thickness (e.g., of a layer, of a material in the growth phase) on a substrate over time. The first structure data may be indicative of original dimensions of the substrate before the substrate deposition processes. The optical metrology data may be used to determine new dimensions of the substrate after deposing material on the substrate over time. The difference between the original dimensions and new dimensions may be used to determine a change in thickness over time (e.g., growth rate).

In some embodiments, the processing logic determines spatial data (e.g., dimensions, x- and y-dimensions, etc.) of the first region over time and, at block 206, the processing logic determines the first growth rate of the first region based on the spatial data of the first region over time.

At block 208, the processing logic predicts, based on the optical metrology data and the first growth rate, thickness data of a second region of the substrate (e.g., without second structure data of the second region).

The thickness data may include one or more of: onset of growth regime of the substrate deposition processes on the second region; region-specific onset of a subsequent atomic layer growth on a layer of similar material in the second region; a thickness difference between the first region and the second region; a deposited thickness on the second region response to at least a portion of the substrate deposition processes; layer thickness data of the second region; atomic layer deposition of the second region; growth data of the second region; spatial loading data of the second region; and/or the like.

In some embodiments, the processing logic predicts the thickness data by using a trained model (e.g., see FIGS. 6A-B and 7A-C). In some embodiments, the predicting of the thickness data is via one or more of a polynomial fit, an empirical model, or a trained machine learning model.

In some embodiments, the predicting of block 208 is further based on an aspect ratio associated with the second region (e.g., a model considering aspect ratio may be included to improve growth rate prediction accuracy for regions made with a different aspect ratio, such as trenches or non-flat device structures).

In some embodiments, the processing logic predicts the thickness data based on offset data (e.g., see FIG. 2B). In some embodiments, if metrology data over time (e.g., signal response rates) of regions are linear, the metrology data can be extrapolated back to time zero (to) to check if expected signals match the measured signals before deposition starts (e.g., see FIG. 2B). If metrology data over time (e.g., signal response rates) are expected to be nonlinear with deposition/ growth cycles, multiple signal collections (e.g., capturing metrology data at multiple points in time) can be captured at the regions along the time dimensions or growth cycles. Each trend can be trained into a model. The trained model can be used to obtain an offset between the expected signal and measured signal prior to deposition and then the onset time of growth regime for each region can be estimated. By comparing thickness growth obtained from the first region (e.g., metrology pad, reference region) and applying the aspect ratio (e.g., model based on the aspect ratio), the thickness growth on regions can be estimated.

In some embodiments, the processing logic predicts spatial signal response (e.g., reflectance) vs. time for regions with different onset growth delays (e.g., using a model trained from at least 3 observations from growth cycles and one pre-deposition observation). In some embodiments, the processing logic estimates the thickness difference between regions over the device wafer by identifying the growth onset time (e.g., if a known reference of deposited thickness on one region is given, the actual thickness on any other region can be estimated).

At block 210, the processing logic causes, based on the thickness data, a corrective action associated with the one or more substrate deposition processes in the processing chamber. In some examples, the corrective action includes one or more of: updating the substrate deposition processes; providing substrate deposition processes to one or more regions (e.g., that have an offset of the growth phase, that have a smaller thickness, etc.) while not providing substrate deposition processes to one or more other regions (e.g., that did not have an offset of the growth phase, that have a greater thickness, etc.); updating manufacturing parameters; interrupting the substrate processing processes; discarding the substrate; providing an alert; and/or the like.

Referring to FIG. 2B, at block 220, the processing logic receives measured data of a second region prior to one or more substrate deposition processes.

At block 222, the processing logic receives optical metrology data (e.g., over time) of the substrate associated with one or more substrate deposition processes in a processing chamber. Block 222 may be similar to block 202 of FIG. 2A.

At block 224, the processing logic determines, based on the optical metrology data, estimated thickness data of the second region.

At block 226, the processing logic extrapolates the estimated thickness data of the second region to the previous point in time (e.g., prior to the substrate deposition processes).

At block 228, the processing logic determines offset data (e.g., offset delay 546 of FIG. 5A) based on a difference between the expected data and measured data of the previous point in time. At block 208 of FIG. 2A, the processing logic may further predict the thickness data based on the offset data of block 228.

Figure 3A:
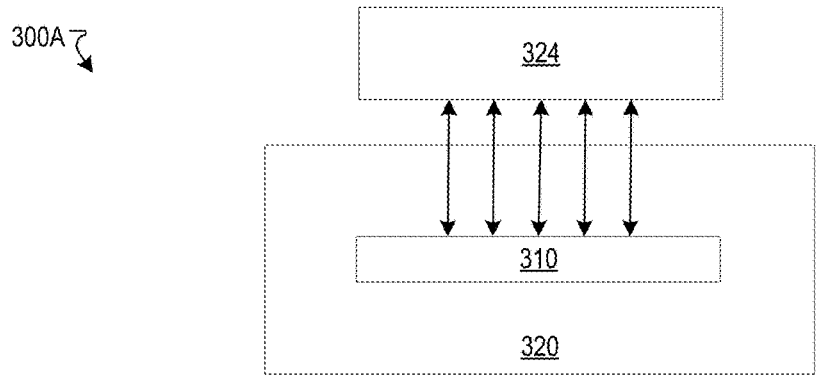
FIGS. 3A-C illustrate metrology equipment used in association with spatial pattern loading measurements, according to certain embodiments.
Figure 3B:
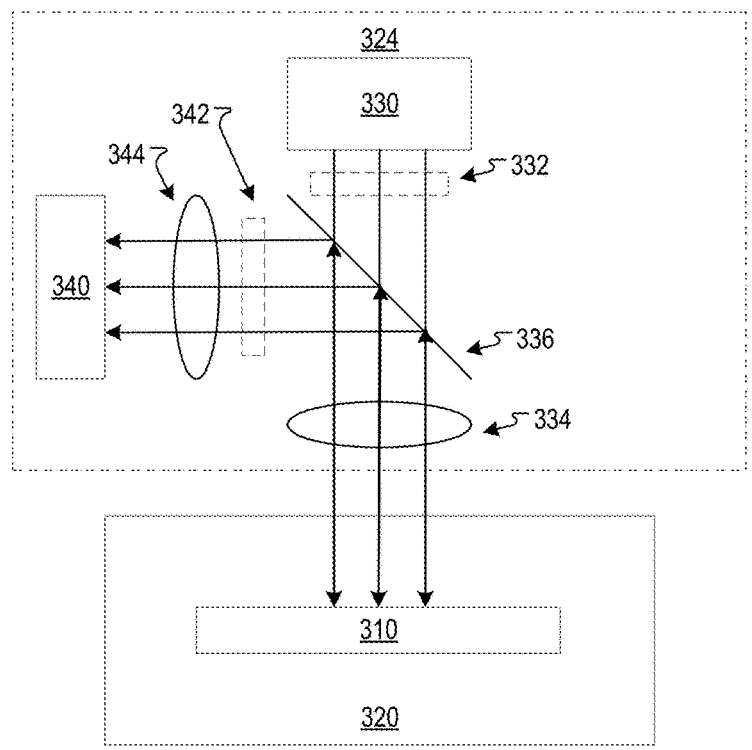
Figure 3C:
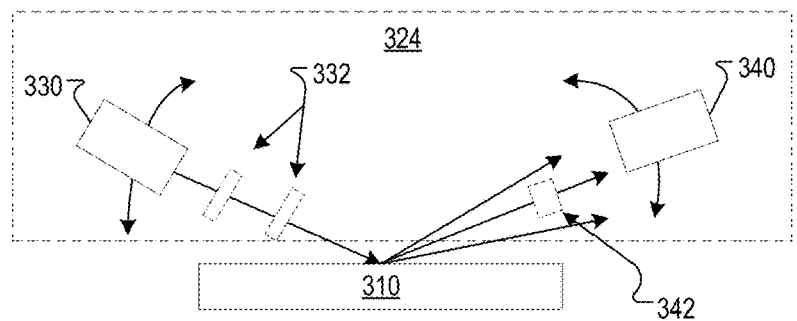

FIGS. 3A-C illustrate systems 300A-C including metrology equipment 324 used in association with spatial pattern loading measurements, according to certain embodiments. Metrology equipment 324 may be used to obtain metrology data (e.g., optical metrology data, signal, reflectance, etc.) associated with a substrate 310 (e.g., different regions of a substrate) over time. Metrology data may be obtained for a region of the substrate 310 where the underlying structure is known and for regions of the substrate 310 where the underlying structure is unknown. The metrology data may be used by one or more of the methods described herein to predict thickness data (e.g., onset of growth regime) of regions where underlying structure is unknown. The thickness data may be used to perform corrective actions associated with the substrate deposition processes.

In some embodiments, the metrology equipment 324 uses scatterometry (e.g., reflectometry-based, spectroscopic ellipsometry) to analyze changes in light properties (e.g., intensity, polarization, phase, etc.) reflected from a device (e.g., memory or logic). A model (e.g., RCWA-based) may be developed to measure the properties of thin-film structures in logic and memory chips and critical dimensions (e.g., gate height, fin height, top critical dimension (CD) widths, bottom CD widths, etc.).

In some embodiments, the metrology equipment 324 uses atomic force microscopy (AFM) to use a tiny probe to enable measurements in chip structures.

In some embodiments, the metrology equipment 324 uses critical-dimension scanning electron microscope (CD-SEM) to use a focused beam of electrons to generate signals at the surface of a structure. CD-SEM may be used for planar transistors, fin field-effect transistors (FinFET) (e.g., measure fin widths, image fin height and sidewall angle with tilt beam capabilities), etc. A back-scattered electron detector can be used to determine the composition or surface topography of a structure.

In some embodiments, the metrology equipment 324 uses critical-dimension small angle x-ray scattering (CD-SAXS) to measure an average shape, edge roughness, pitch walking, and/or the like of periodic nanostructures.

In some embodiments, the metrology equipment 324 uses a hybrid metrology to use a mix-and-match of multiple different tool technologies and combines the data from each. In some examples, a FinFET structure is measured by both the CD-SEM and an AFM and the results are fed into an OCD tool to validate the model.

The metrology equipment 324 may generate and propagate a pulse of light with a controlled wavelength bandwidth (e.g., less than 20 nanometers) and illumination size towards a substrate 310 (e.g., target sample) through collimating lenses. The light properties may be modified before arriving at the substrate 310. The change of light properties due to interaction with the substrate 310 is reflected back to the detector 340 for spatial signal recording. These operations may be repeated for other wavelength bands.

Referring to FIG. 3A, metrology equipment 324 (e.g., metrology equipment 124 of FIG. 1) may be configured to obtain metrology data (e.g., optical metrology data, reflectometry data) of a substrate 310 while the substrate 310 is disposed in substrate processing equipment 320 (e.g., substrate processing equipment of 120 of FIG. 1, ALD process chamber), such as in a processing chamber. The metrology equipment 324 may obtain metrology data of the substrate 310 before, during, and/or after one or more substrate processing operations (e.g., substrate deposition processes). The metrology equipment 324 may transmit light towards the substrate 310 and measure the reflected light received from the substrate 310. The metrology data may include the measured reflected light.

Referring to FIG. 3B, the metrology equipment 324 may include a light source 330 and a detector 340. The light source 330 may provide light to the substrate 310, the light may reflect off of the substrate 310, be directed by component 336, and be received by detector 340. In some embodiments, as the light goes from the light source 330 to the substrate 310, the light goes through one or more components 332 (e.g., to modify light properties), such as a polarizer, compensator, and/or wave plate. As the light goes from the substrate 310 towards the component 336, the light may go through a component 334, such as a telecentric lens. As the light is directed by the component 336 to the detector 340, the light may go through a component 342, such as an analyzer (e.g., to analyze light properties, such as polarization, phase, etc.), and a component 344, such as a focus lens.

Referring to FIG. 3C, the metrology equipment 324 may include a light source and a detector 340. The light source 330 may provide light at an angle to the substrate 310 and the detector 340 may detect the light at an angle from the substrate 310. In some embodiments, the light from the light source 330 passes through one or more components 332 (e.g., polarizer, compensator, etc.) before arriving at the substrate 310 and the light reflected from the substrate 310 goes through one or more components 342 (e.g., analyzer) before arriving at the detector 340. The light source 330 and/or detector 340 may be movable (e.g., rotatable) to provide light and/or receive light at different angles.

FIGS. 4A-J illustrate substrates 410 associated with spatial pattern loading measurements, according to certain embodiments.

Referring to FIG. 4A, a substrate 410 may include multiple die regions 412. Referring to FIG. 4B (e.g., an enlarged view of FIG. 4A), a substrate 410 may have die regions 412 (e.g., die regions 412A-C) that are separated by non-functioning areas 414. Region A is in the non-functioning area 414 (e.g., scribe lines) while regions B, C, D, and F are on the die region 412B. Region A may be a metrology pad. The different regions A, B, C, D, and F may have different surfaces, features, attributes, etc.

In some embodiments, region A is a placement of optical critical dimension (OCD) scatterometry target relative to the active device area (e.g., die region, functioning area). The active device area may include billions of devices that constitute a successfully patterned computer chip.

More structure data (e.g., underlying structure) may be known for the region A than for regions B, C, D, and F. In some embodiments, structure data (e.g., underlying structure) is not disclosed or is not known for regions B, C, D, and F.

Metrology equipment (e.g., metrology equipment 324 of FIGS. 3A-C, metrology equipment 124 of FIG. 1) may obtain metrology data (e.g., optical metrology data, reflectometry data) of the regions A, B, C, D, and F before, during, and/or after one or more substrate deposition processes. The metrology data may be obtained periodically, after more critical substrate deposition processes, etc.

Common substrate deposition processes include the addition of a new layer of atoms over a surface made of different materials (e.g., nucleation phase). The addition of one or more new atomic layers may not be conformal spatially and at times may form patches at different locations on the substrate 310 (e.g., at time ti). Original surface of the substrate 410 may be corrugated, could be non-uniform, could have two-dimensional or 3-dimensional periodical critical dimensions inherited from previous processes, and/or the like which can cause increased non-uniformity of the new layer on the substrate 310.

An in-situ monitoring can be used to monitor the nucleation phase and growth phase of the deposition processes. The spatial information from the substrate (e.g., signal change vs time or cycles) can provide indicators. A first specific area (e.g., region) may be fully coated with new deposited materials (e.g., single atomic layer, such as ALD) at time $t_1$ while a second specific region is not fully coated with new deposited materials. When a first specific area undergoes a growth phase, one or more subsequent layers (e.g., $t_1 < t < t_n$). The current top material in the growth phase may be similar to incoming materials of deposition.

FIGS. 4C-F illustrate substrates 410 including regions that have material deposed on the regions. FIGS. 4C and 4E may illustrate the nucleation phase and FIGS. 4D and 4F may illustrate the growth phase.

In some embodiments, a substrate may have deposition of binary materials. In a first process a first reactant reacts in a self-terminating way with available groups on a surface of the substrate. In a second process, excess of the first reactant and gaseous by-products are purged or pumped away. In a third process, a second reactant reacts in a self-terminating way with the absorbed species (e.g., first reactant) on the surface. In a fourth process, the excess of the second reactant and the gaseous by-products are purged or pumped away. Successful adsorption rate of precursor at the first process may determine how fast a full single layer can be deposited. More than one cycle may be used to fully form a single layer of atomic deposition (e.g., less than one layer growth per one growth cycle). Linear increase of deposited thickness or constant growth-per-cycle can be expected after a certain number of growth and/or reaction cycles (e.g., an initial regime and then a transient regime, and then a linear regime).

In some embodiments, deposition (e.g., ALD deposition) onto two surface regions made of different materials or chemistry experience different sticking coefficients. Dosing time can affect coverage. Non-optimized dosing time (e.g., in reaction-limited regime) can cause island growth and onset delay of growth regime (e.g., controlled multilayer growth).

Each region takes time to establish a full conformal coating of one atomic and/or molecular layer covering the underneath layer of different materials (e.g., nucleation phase). Aspect ratio (AR) can further complicate the diffusion length (e.g., in diffusion-limited regime) and can further delay the nucleation phase.

In the growth phase, depositions are made onto a surface made of the same materials. Island growth may occur during the first few cycles followed by a fully covered zone after a few growth cycles. In the growth phase, surfaces with a high AR can experience slower growth rate.

Referring to FIG. 4C, during the nucleation phase (e.g., nucleation regime), material starts to form on a different type of material. Due to differences in physical and/or chemical attributes, the new material may cover region B before the new material covers regions C. Due to a physical attribute (e.g., trench), the new material may be delayed in covering the sides of regions D and the area between the regions D.

Referring to FIG. 4D, during the growth phase (e.g., growth regime), material is formed on the same type of material. The regions that were covered in the new material sooner (e.g., region B, ending nucleation phase sooner) have a sooner onset of the growth phase and the regions that were covered in the new material later (e.g., region C, ending nucleation phase later) have a later onset of the growth phase.

Since top surface of regions could be different from each other (e.g., in physical and/or chemistry properties), the spatial pattern loading effect resulting from subsequent substrate deposition process is to be well-controlled and monitored. Being able to control and measure the effectiveness of deposition onto the regions results in yield improvement. A metrology pad at region A may not give an accurate prediction or correlation of what happens at active device area (e.g., region B, C, D, and/or F of die region 412B) which may contain different surface chemistries and/or physical properties. The spatial difference in the onset delay of growth phase results in thickness non-uniformity spatially as shown in FIG. 4D.

Referring to FIG. 4E, region A may have a full conformal coating before region B has a full conformal coating. Referring to FIG. 4F, due to having a full conformal coating sooner, region A may have an onset of the growth phase prior to the onset of the growth phase for the region B which causes region A to have a greater thickness than region B.

Referring to FIGS. 4G-4J, material may be deposited on a substrate 410. Flux controlled (e.g., chemical vapor deposition (CVD), physical vapor deposition (PVD)) film growth may be controlled based on manufacturing parameters, such as local gas flux. FIG. 4G illustrates a substrate 410 prior to substrate deposition processes. FIG. 4H illustrates a substrate 410 with material deposited on an upper surface and a portion of the sidewalls of the trench of the substrate 410. FIG. 4I illustrates a substantially uniform layer of material on the upper surface, sidewalls, and bottom of a trench of the substrate 410. FIG. 4J illustrates a first thickness of material on the upper surface and a first portion of the sidewalls and a second thickness of material on a second portion of the sidewalls and the bottom of the trench of the substrate 410. By predicting thickness data based on metrology data, the substrate deposition processes may be adjusted (e.g., adjust local gas flux) to provide more uniform layers on regions of the substrate 410.

Figure 5A:
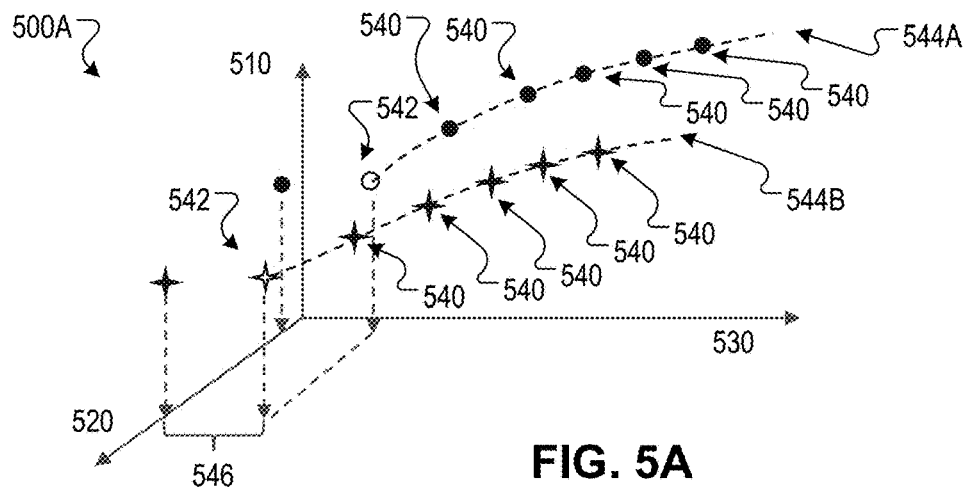
FIGS. 5A-C illustrate graphs associated with spatial pattern loading measurements, according to certain embodiments.
Figure 5B:
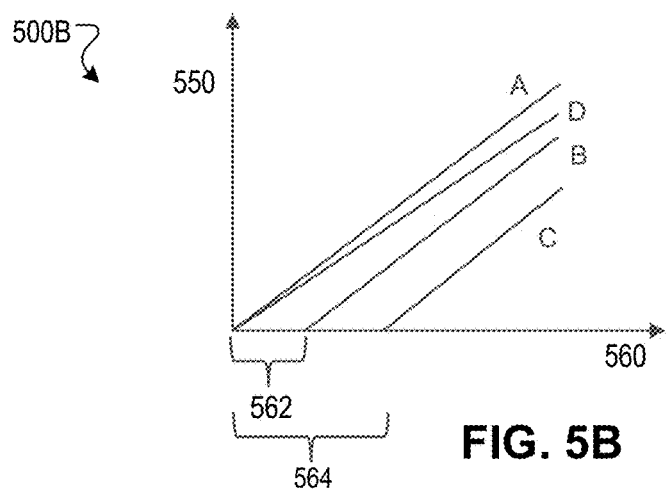

FIGS. 5A-B illustrate graphs 500A-B of spatial pattern loading measurements, according to certain embodiments.

Referring to FIG. 5A, graph 500A includes a metrology data axis 510 (e.g., signal, reflectance data, optical metrology data), a wavelength band axis 520 (e.g., wavelength of the light provided by the metrology equipment), and a temporal axis 530 (e.g., time axis, number of growth cycle axis). Measured data 540 is illustrated as solid points (e.g., solid circles, solid stars, etc.) and refer to a measured signal change from a monitoring device (e.g., metrology data from the metrology equipment). Predicted data 542 is illustrated as unfilled points (e.g., unfilled circles, unfilled stars, etc.) refer to predicted point from fitting the measured signal points with a model (e.g., polynomial model, empirical model, machine learning model). The predicted data 542 may refer to the onset of the growth phase on a region of a substrate. The data trends 544A-B are illustrated as dashed lines (e.g., connecting measured data 540 and predicted data 542) refer to a generated signal trend from a model (e.g., empirical model) trained from measured data 540. In some embodiments, data trend 544A may refer to a first wavelength (e.g., first wavelength of light provided by metrology equipment to the substrate) and data trend 544B may refer to a second wavelength that is different from the first wavelength.

Offset delay 546 refers to an offset along the temporal axis for the first predicted data 542 (e.g., how much time or how many growth cycles did it take to start the predicted data 542 of the onset of the growth phase).

A measured signal (e.g., R(t)) along the time/growth cycles can be used to provide a predicted signal trend using either polynomial fit, empirical model, or machine learning prediction. The predicted signal at the time of onset of the growth phase can then be obtained. By extrapolating the time difference of onset of the growth phase between the reference region (e.g., region A, metrology pad, non-functioning region where the underlying structure is known) and the target region (e.g., region where the underlying structure is unknown, region where less is known about the underlying structure than the reference region, functioning region), the thickness difference can be estimated (e.g., absolute thickness of deposition).

Referring to FIG. 5B, graph 500B illustrates in-die pattern loading effect (e.g., due to growth onset). Region A may be a reference region. A model (e.g., rigorous coupled-wave analysis (RCWA) model, using finite-difference time-domain (FDTD) method, etc.) may be fit with metrology data (e.g., reflectance data, R(t)) that has been acquired. The growth rate may be determined at region A (e.g., change in thickness over time (dp/dt) based on the metrology data received over time) and the absolute thickness (p(t)) at a given time may also be determined. The growth rate at regions B, C, and D in growth phase (e.g., growth regime) may be estimated or predicted. A region that has properties (e.g., a physical aspect ratio (AR), physical priorities, chemical properties, surface, etc.) similar to properties of region A (e.g., meet a first threshold value) may have a similar growth rate (dp/dt). For regions (e.g., without known structure data) that have properties that are significantly different (e.g., meet a second threshold value) from a reference region (e.g., with known structure data), the growth rate (dp/dt) may be approximated with an aspect ratio (e.g., a known Gordon's aspect ratio difference) if the regions are within the same die as the reference region.

Graph 500B has an axis 550 (e.g., thickness (p), thickness of growth phase, etc.) and an axis 560 (e.g., time(t) and/or growth onset). Each line A, B, C, and D on graph 500B refers to a different region of a substrate (e.g., of the same die region). Regions A and D start growth onset at a first point in time, region B starts growth onset at time 562 ($t_{onset,B}$), and region C starts growth onset at time 564 ($t_{onset,C}$) The following equations may be used:

$$est.\ p_{offset} \approx est.\ t_{onset} \times \frac{dp}{dt}_{A,B}$$

$$p(t)_{onB} \approx p(t)_{onA} + est.\ p_{offset}$$

The variable est.$p_{offset}$ is an estimate of the thickness offset (e.g., variation in thickness due to delayed onset of growth phase) and may be learned from R(x,y,t) by a model (e.g., empirical model, mathematical model, machine learning model). The variable est $t_{onset}$ may be an estimate of the time delay in onset of growth phase. The variable dp/(dt(A,B)) is a growth rate (change in thickness over change in time). The variable $p(t)_{onB}$ thickness of region B at time t and may be inferred by identifying is a time or number of growth cycles for the onset of growth phase. The variable $p(t)_{on\ A}$ is a thickness of region A at time t and may be derived from $R_A(t)$ or measured by other non-destructive metrology tools.

With the growth rate information at B and C, the onset of growth phase at B and C ($t_{onset}$) may be identified.

Using an in-situ reflectometry-based imaging system at deposition process chamber, the spatial and time information of signal R(x,y,t) acquired can be used to measure thickness of deposited films at region A and to predict thickness at any other regions in device area (e.g., die region).

If the structure data of region A is known, metrology data (e.g., signal, R(x,y,t)) acquired at region A can be used to retrieve thickness change (p(t)) via an inverse-problem approach and provide information about growth rate at A, B, C, and D as well.

Figure 5C:
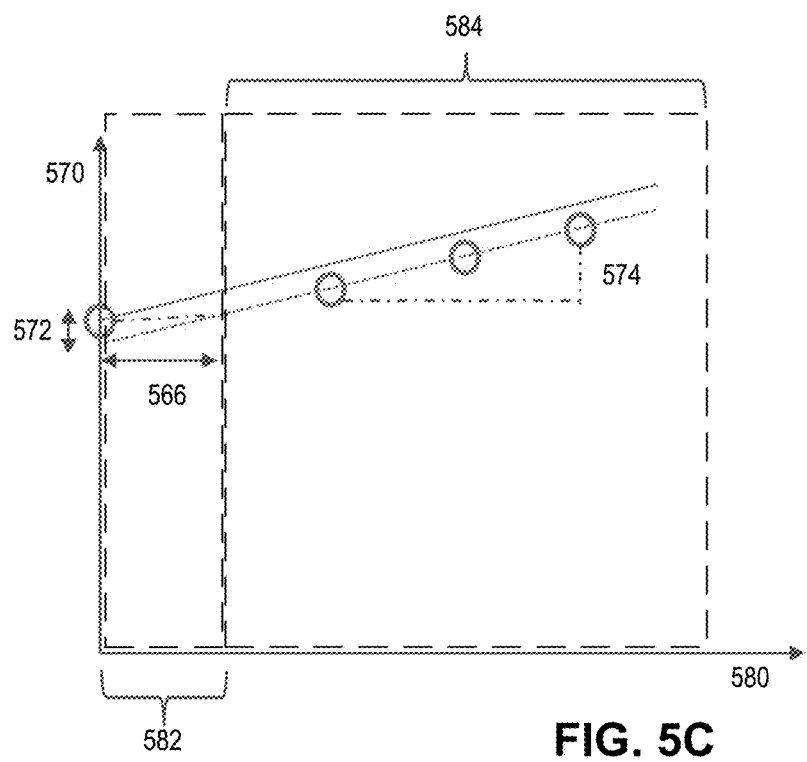

Referring to FIG. 5C, graph 500C includes a first axis 570 (e.g., signal (R), metrology data) and a second axis 580 (e.g., time (t) and/or growth cycle). Distance 566 may be the time to onset of growth regime (e.g., $t_{onset}$). Distance 572 may be the change in signal at time zero (e.g., $dR_{B,t=0}$). Distance 574 may be the change in metrology data over the change in thickness (e.g., dR/dp).

A first portion of the graph 500C is an activation zone 582 (e.g., nucleation regime, first material deposition on a second material surface). One or more surfaces may not have a full conformal coating yet (e.g., see FIG. 4E).

A second portion of the graph 500C is the growth regime 584 (e.g., first material deposition of a first material surface, see FIG. 4F). In some embodiments, the growth rate (e.g., dp/dt) may be similar for different regions that have similar properties (e.g., similar surfaces, similar chemistry, similar physical properties, similar aspect ratio, etc.).

In some embodiments, signal change (e.g., change in metrology data, dR) with thickness increment or growth time is substantially linear. Multiple data points (e.g., at least three data points collected over time) of metrology data for a reference region (e.g., region A) after the substrate deposition processes began may be used with at least one data point of metrology data of the reference region prior to the substrate deposition processes. Multiple data points (e.g., 3-point signal collection) of a functional region (e.g., region B, on various dies) can be collected to learn change in metrology data over change in time (e.g., dR/dt) behavior. This can be extrapolated to determine if there is a delay of the onset of growth regime. The growth rate can be learned from the previous growth model (e.g., dp/dt). The thickness offset between regions A and B can be estimated. The following equations may be used:

$$est.\ t_{onset,B} \approx dR_{t=0} \times \frac{1}{\frac{dR}{dt}_B}$$

The variable est.$t_{onset,B}$ may be an estimate of time of onset of growth phase at region B. The variable $dR_{t=0}$ may be change in metrology data at time zero. The variable dR/dtB may be change in metrology data over change in time for region B (e.g., can be non-linear and extrapolated with a model).

$$est.\ p_{offset} \approx est.\ t_{onset} \times \frac{dp}{dt}_{A,B}$$

The variable est.$p_{offset}$ may be an estimate of thickness offset. The variable est.$t_{onset}$ may be estimated time of onset of growth phase. The variable dp/dtA,B may be growth rate (e.g., change in thickness over change in time) and can be approximated by a growth model if difference in AR of regions A and B exceeds a threshold value.

$$p(t)_{on\ B} \approx P(t)_{onA} + est \cdot p_{offset}$$

The variable $p(t)_{onB}$ may be change in thickness of onset of growth phase at region B. The variable $p(t)_{onA}$ may be thickness at time of onset at region A and can be derived from $R_A(t)$ (e.g., metrology data of region A) or measured with an OCD model. The variable est.$p_{offset}$ may be estimated thickness offset.

Figure 6A:
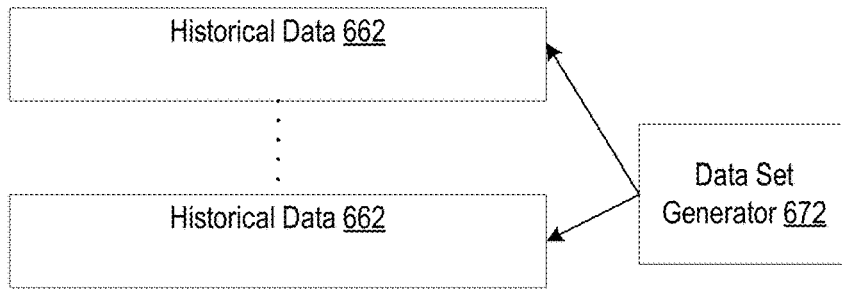
FIG. 6A is an example data set generator to create data sets for a model, according to certain embodiments.
Figure 6B:
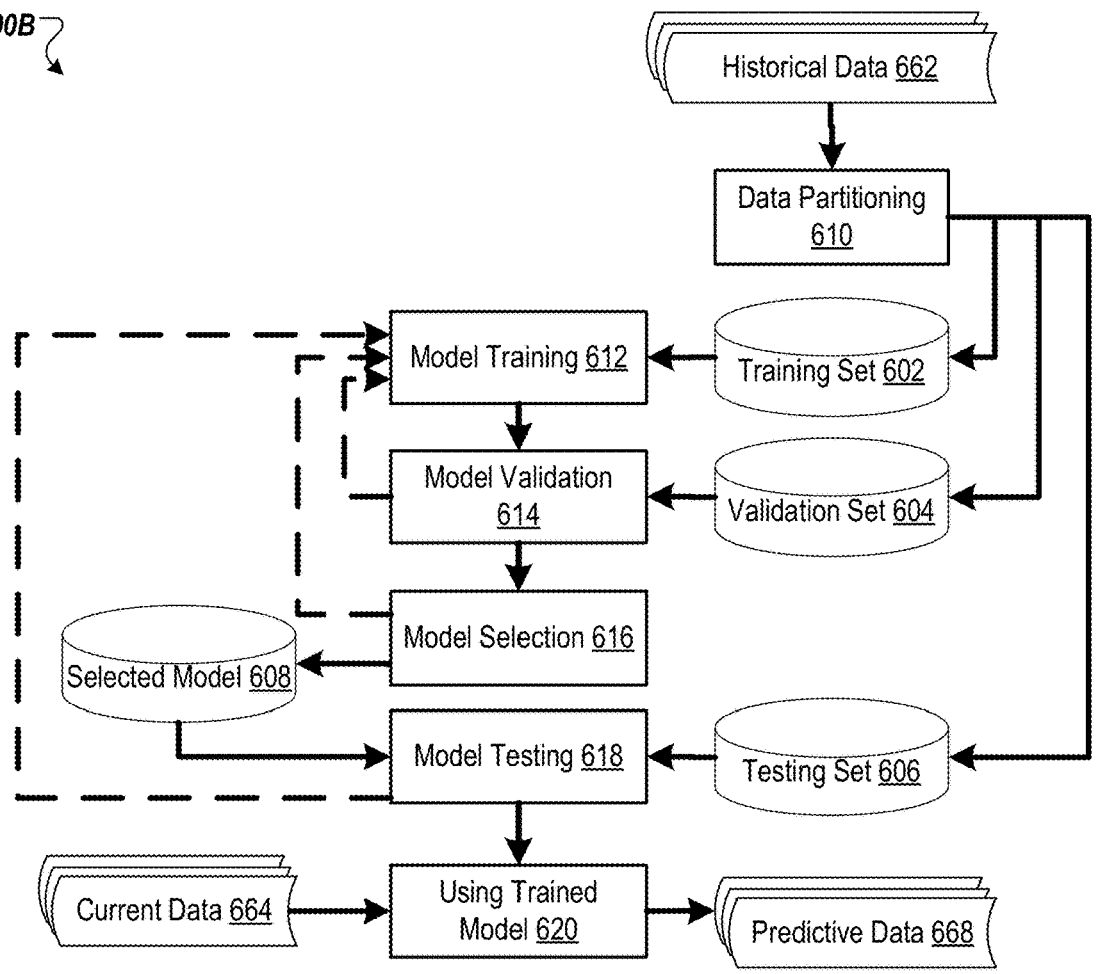
FIG. 6B is a block diagram illustrating determining predictive data, according to certain embodiments.

FIG. 6A is an example data set generator 672 (e.g., data set generator 172 of FIG. 1) to create data sets for a model (e.g., model 190 of FIG. 1) using historical data 662 (e.g., historical data 162 of FIG. 1), according to certain embodiments. System 600A of FIG. 6A shows data set generator 672 and data inputs 601.

In some embodiments, data set generator 672 generates a data set (e.g., training set, validating set, testing set) that includes one or more data inputs 601 (e.g., training input, validating input, testing input). Data inputs 601 may also be referred to as "features," "attributes," or "information." In some embodiments, data set generator 672 may provide the data set to the training engine 182, validating engine 184, or testing engine 186, where the data set is used to train, validate, or test the model 190. Some embodiments of generating a training set may further be described with respect to FIG. 7A.

In some embodiments, data set generator 672 generates the data input 601 based on historical data 662. In some embodiments, data inputs 601 may include one or more sets of features for the historical data 662. Each instance of historical data 662 may include sensor data from one or more types of sensors and/or metrology data associated with one or more types of substrates.

In some embodiments, data set generator 672 may generate a first data input corresponding to a first set of features to train, validate, or test a first model and the data set generator 672 may generate a second data input corresponding to a second set of features to train, validate, or test a second model.

In some embodiments, the data set generator 672 may discretize the data input 601 (e.g., to use in classification algorithms for regression problems). Discretization of the data input 601 may transform continuous values of variables into discrete values. In some embodiments, the discrete values for the data input 601 indicate discrete manufacturing parameters and/or property data of substrates.

Data inputs 601 to train, validate, or test a model may include information for a particular facility (e.g., for a particular substrate manufacturing facility). For example, the historical data 662 may be for the same manufacturing facility.

In some embodiments, the information used to train the model may be from specific types of manufacturing equipment (e.g., substrate processing equipment 120) of the manufacturing facility having specific characteristics and allow the trained model to determine outcomes for a specific group of manufacturing equipment based on input for historical data 662 associated with one or more components sharing characteristics of the specific group. In some embodiments, the information used to train the model may be for components from two or more manufacturing facilities and may allow the trained model to determine outcomes for components based on input from one manufacturing facility.

In some embodiments, subsequent to generating a data set and training, validating, or testing model 190 using the data set, the model 190 may be further trained, validated, or tested (e.g., further historical data 662 of FIG. 1) or adjusted (e.g., adjusting weights associated with input data of the model 190, such as connection weights in a neural network).

FIG. 4B is a block diagram illustrating a system 400 for generating predictive data 668 (e.g., predictive data 168 of FIG. 1), according to certain embodiments. The system 600B may be used to determine a corrective action associated with substrate deposition processes of substrate processing equipment 120 based on historical data 662 (e.g., historical data 162 of FIG. 1).

At block 610, the system 600 (e.g., predictive system 110 of FIG. 1) performs data partitioning (e.g., via data set generator 172 of server machine 170 of FIG. 1) of the historical data 662 (e.g., historical data 162 of FIG. 1) to generate the training set 602, validation set 604, and testing set 606. For example, the training set may be 60% of the historical data 662, the validation set may be 20% of the historical data 662, and the validation set may be 20% of the historical data 662. The system 600 may generate a plurality of sets of features for each of the training set, the validation set, and the testing set. For example, if the historical data 662 is associated with 20 sensors (e.g., sensors 126 of FIGS. 1) and 100 products (e.g., wafers that each correspond to the sensor data from the 20 sensors), a first set of features may be sensors 1-10, a second set of features may be sensors 11-20, the training set may be products 1-60, the validation set may be products 61-80, and the testing set may be products 81-100. In this example, the first set of features of the training set would be from sensors 1-10 for products 1-60.

At block 612, the system 600 performs model training (e.g., via training engine 182 of FIG. 1) using the training set 602. The system 600 may train multiple models using multiple sets of features of the training set 602 (e.g., a first set of features of the training set 602, a second set of features of the training set 602, etc.). For example, system 600 may train a model to generate a first trained model using the first set of features in the training set (e.g., sensor data from sensors 1-10 for products 1-60) and to generate a second trained model using the second set of features in the training set (e.g., sensor data from sensors 11-20 for products 1-60). In some embodiments, the first trained model and the second trained model may be combined to generate a third trained model (e.g., which may be a better predictor than the first or the second trained model on its own). In some embodiments, sets of features used in comparing models may overlap (e.g., first set of features being from sensors 1-15 and second set of features being from sensors 5-20). In some embodiments, hundreds of models may be generated including models with various permutations of features and combinations of models.

At block 614, the system 600 performs model validation (e.g., via validation engine 184 of FIG. 1) using the validation set 604. The system 600 may validate each of the trained models using a corresponding set of features of the validation set 604. For example, system 600 may validate the first trained model using the first set of features in the validation set (e.g., sensor data from sensors 1-10 for products 61-80) and the second trained model using the second set of features in the validation set (e.g., sensor data from sensors 11-20 for products 61-80). In some embodiments, the system 600 may validate hundreds of models (e.g., models with various permutations of features, combinations of models, etc.) generated at block 612. At block 614, the system 600 may determine an accuracy of each of the one or more trained models (e.g., via model validation) and may determine whether one or more of the trained models has an accuracy that meets a threshold accuracy. Responsive to determining that none of the trained models has an accuracy that meets a threshold accuracy, flow returns to block 612 where the system 600 performs model training using different sets of features of the training set. Responsive to determining that one or more of the trained models has an accuracy that meets a threshold accuracy, flow continues to block 616. The system 600 may discard the trained models that have an accuracy that is below the threshold accuracy (e.g., based on the validation set).

At block 616, the system 600 performs model selection (e.g., via selection engine 185 of FIG. 1) to determine which of the one or more trained models that meet the threshold accuracy has the highest accuracy (e.g., the selected model 608, based on the validating of block 614). Responsive to determining that two or more of the trained models that meet the threshold accuracy have the same accuracy, flow may return to block 612 where the system 600 performs model training using further refined training sets corresponding to further refined sets of features for determining a trained model that has the highest accuracy.

At block 618, the system 600 performs model testing (e.g., via testing engine 186 of FIG. 1) using the testing set 606 to test the selected model 608. The system 600 may test, using the first set of features in the testing set (e.g., sensor data from sensors 1-10 for products 81-100), the first trained model to determine the first trained model meets a threshold accuracy (e.g., based on the first set of features of the testing set 606). Responsive to accuracy of the selected model 608 not meeting the threshold accuracy (e.g., the selected model 608 is overly fit to the training set 602 and/or validation set 604 and is not applicable to other data sets such as the testing set 606), flow continues to block 612 where the system 600 performs model training (e.g., retraining) using different training sets corresponding to different sets of features (e.g., sensor data from different sensors). Responsive to determining that the selected model 608 has an accuracy that meets a threshold accuracy based on the testing set 606, flow continues to block 620. In at least block 612, the model may learn patterns in the historical data 662 to make predictions and in block 618, the system 600 may apply the model on the remaining data (e.g., testing set 606) to test the predictions.

At block 620, system 600 uses the trained model (e.g., selected model 608) to receive current data 664 (e.g., current data 164 of FIG. 1, current historical data 162 of FIG. 1) and determines (e.g., extracts), from the output of the trained model, predictive data 668 (e.g., predictive data 168 of FIG. 1) to perform corrective actions associated with substrate deposition processes of a processing chamber.

In some embodiments, one or more operations of the blocks 610-620 may occur in various orders and/or with other operations not presented and described herein. In some embodiments, one or more operations of blocks 610-620 may not be performed. For example, in some embodiments, one or more of data partitioning of block 610, model validation of block 614, model selection of block 616, or model testing of block 618 may not be performed.

Figure 7A:
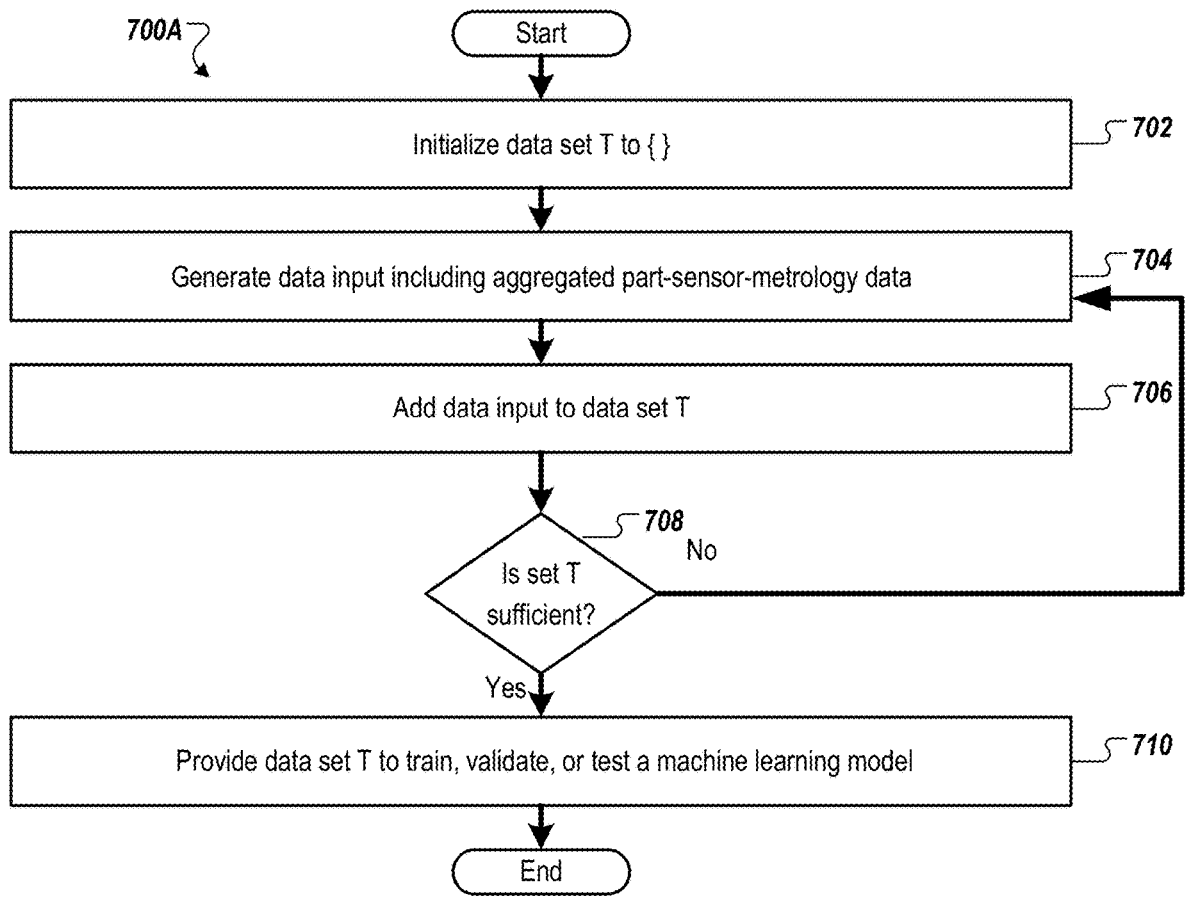
FIGS. 7A-C are flow diagrams of methods associated with spatial pattern loading measurements, according to certain embodiments.
Figure 7B:
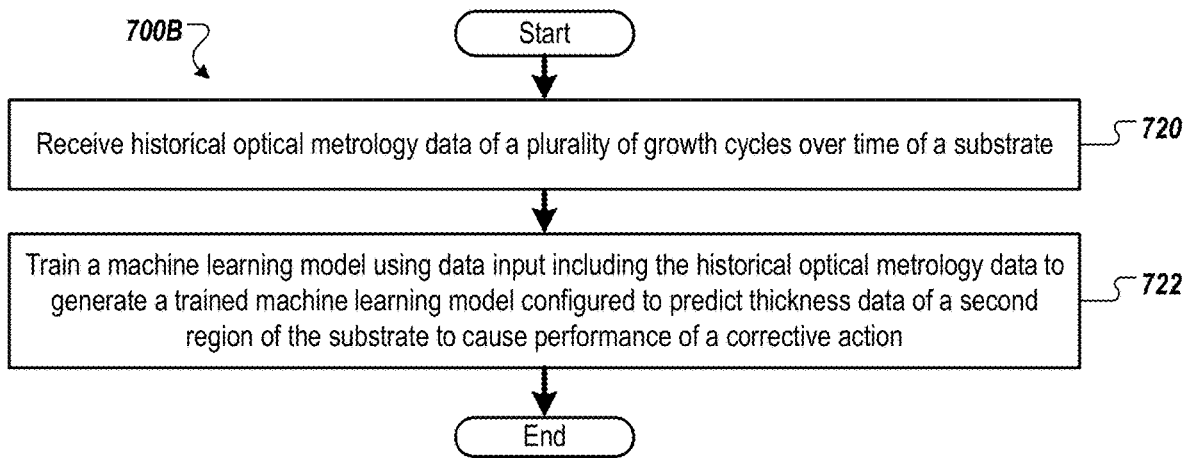
Figure 7C:
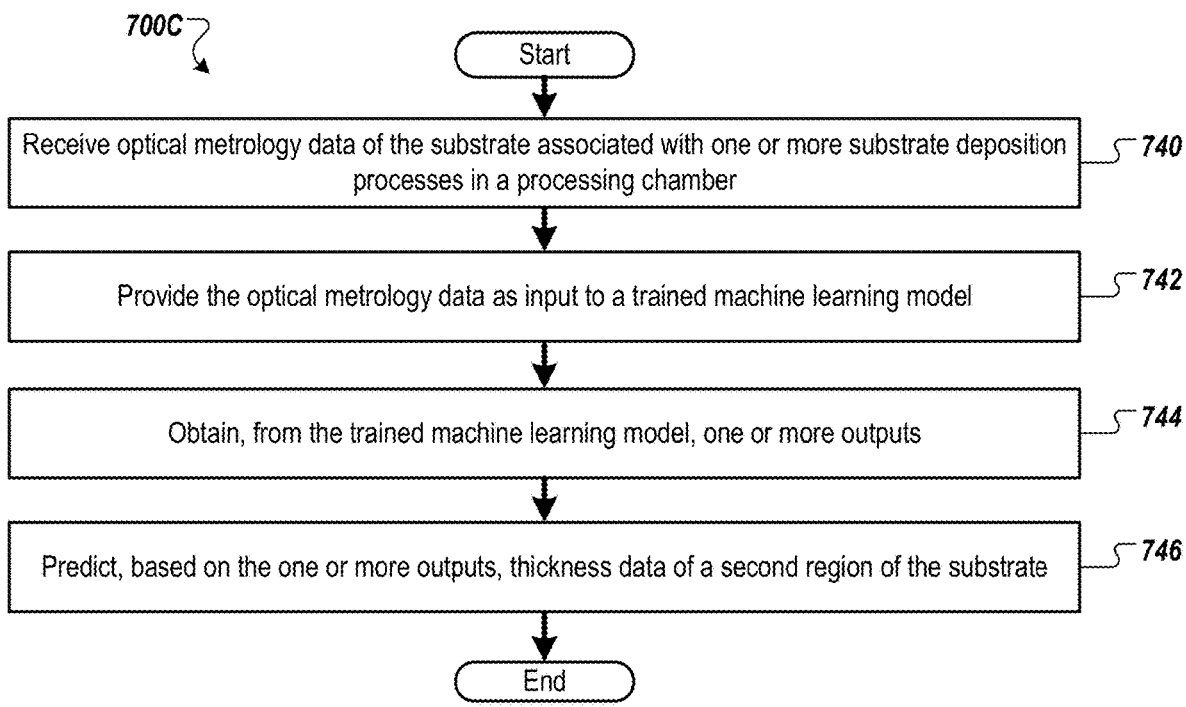

FIGS. 7A-C are flow diagrams of methods 700A-C associated with part, sensor, and metrology data integration, according to certain embodiments. Methods 700A-C may be performed by processing logic that may include hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiments, method 700A may be performed, in part, by predictive system 110 (e.g., server machine 170, data set generator 172, etc.). Predictive system 110 may use method 700A to at least one of train, validate, or test a model, in accordance with embodiments of the disclosure. In some embodiments, one or more operations of method 700A may be performed by data set generator 172 of server machine 170 as described with respect to FIGS. 1 and 6A. In some embodiments, methods 700B-C may be performed, in part, by predictive system 110 (e.g., predictive server 112, predictive component 114, etc.). Predictive system 110 may use method 700B to train a model, in accordance with embodiments of the disclosure. Predictive system 110 may use method 700C to use a trained model, in accordance with embodiments of the disclosure. In some embodiments, one or more operations of methods 700B-C may be performed by predictive component 114 of predictive server 112 as described with respect to FIGS. 1 and 6B. It may be noted that components described with respect to one or more of FIG. 1, 2, or 6A-B may be used to illustrate aspects of FIGS. 7A-C. In some embodiments, a non-transitory storage medium stores instructions that when executed by a processing device (e.g., of predictive system 110) cause the processing device to perform methods 700A-C.

For simplicity of explanation, methods 700A-C are depicted and described as a series of acts. However, acts in accordance with this disclosure can occur in various orders and/or concurrently and with other acts not presented and described herein. Furthermore, not all illustrated acts may be performed to implement the methods 700A-C in accordance with the disclosed subject matter. In addition, those skilled in the art will understand and appreciate that the methods 700A-C could alternatively be represented as a series of interrelated states via a state diagram or events.

Referring to FIG. 7A, method 700A is associated with generating a data set for a model for performing a corrective action associated with substrate deposition processes.

At block 702 the processing logic implementing method 700A initializes a training set T to an empty set.

At block 704, processing logic generates first data input (e.g., first training input, first validating input) that includes historical data (e.g., historical data 162 of FIG. 1). In some embodiments, the first data input may include a first set of features for types of historical data and a second data input may include a second set of features for types of historical data (e.g., as described with respect to FIG. 6A). The processing logic may generate the data input based on portions of the historical data 162 (e.g., structure data 152, sensor data 154, metrology data 156, etc.).

At block 706, processing logic adds the data input generated at block 704 to data set T.

At block 708, processing logic branches based on whether data set T is sufficient for at least one of training, validating, and/or testing model 190. If so, execution proceeds to block 710, otherwise, execution continues back at block 704. In some embodiments, the sufficiency of data set T may be determined based simply on the amount of data in the data set, while in some other implementations, the sufficiency of data set T may be determined based on one or more other criteria (e.g., a measure of diversity of the data examples, accuracy, etc.) in addition to, or instead of, the amount of data in the data set.

At block 710, processing logic provides data set T (e.g., to server machine 180) to train, validate, and/or test model 190. In some embodiments, data set T is a training set and is provided to training engine 182 of server machine 180 to perform the training. In some embodiments, data set T is a validation set and is provided to validation engine 184 of server machine 180 to perform the validating. In some embodiments, data set T is a testing set and is provided to testing engine 186 of server machine 180 to perform the testing. In the case of a neural network, for example, input values (e.g., numerical values associated with data inputs 601) are input to the neural network. The connection weights in the neural network are then adjusted in accordance with a learning algorithm (e.g., back propagation, etc.), and the procedure is repeated for the other input/output mappings in data set T. After block 710, model (e.g., model 190) can be at least one of trained using training engine 182 of server machine 180, validated using validating engine 184 of server machine 180, or tested using testing engine 186 of server machine 180. The trained model may be implemented by predictive component 114 (of predictive server 112) to generate predictive data 168 for performing corrective action associated with substrate deposition processes of substrate processing equipment 120.

Referring to FIG. 7B, method 700B is associated with training a model for performing a corrective action associated with substrate deposition processes.

At block 720, processing logic identifies historical data (e.g., historical metrology data, historical optical metrology data) associated with substrate deposition processes of substrate processing equipment (e.g., growth cycles over time of a substrate). The historical data may be generated from sensor data of substrate processing operations performed by substrate processing equipment and/or metrology data of the substrate. The sets of historical data may correspond to one or more substrates that have been produced.

At block 722, processing logic trains a model using data input including the historical data to generate a trained model configured to generate outputs associated with predicting thickness data to cause performance of a corrective action associated with substrate deposition processes of substrate processing equipment.

In some embodiments, the model is trained based on data input (e.g., without target output) to generate an unsupervised trained model (e.g., to cluster data). In some embodiments, the model is trained based on data input and target output to generate a supervised trained model.

Referring to FIG. 7C, method 700C is associated with using a model for performing a corrective action associated with substrate deposition processes of substrate processing equipment.

At block 740, processing logic receives current data (e.g., metrology data, optical metrology data) associated with substrate deposition processes in a processing chamber. In some embodiments, the current data includes metrology data and/or sensor data over time.

At block 742, processing logic provides the current data to a trained model. In some embodiments, the trained model is trained by method 700B. In some embodiments, the model is one or more of a polynomial fit, an empirical model, or a trained machine learning model.

At block 744, processing logic obtains, from the trained model, one or more outputs indicative of predictive data (e.g., thickness data of block 208 of FIG. 2A). In some embodiments, the predictive data is predictive thickness data (e.g., predicted onset of growth phase, predicted thickness, predicted thickness variation, predictive metrology data, etc.). In some embodiments, the predictive data is an indication of similarity between historical data and the current data (e.g., the historical data and current data are part of the same cluster, the current data is not clustered with any of the historical data) (e.g., result from an unsupervised model).

In some embodiments, a corrective action is performed based on the predictive data (e.g., see block 210 of FIG. 2A). In some embodiments, the corrective action comprises adjusting substrate production (e.g., substrate processing operations, hardware of the substrate processing equipment, manufacturing parameters of the substrate processing operations, etc.).

Figure 8:
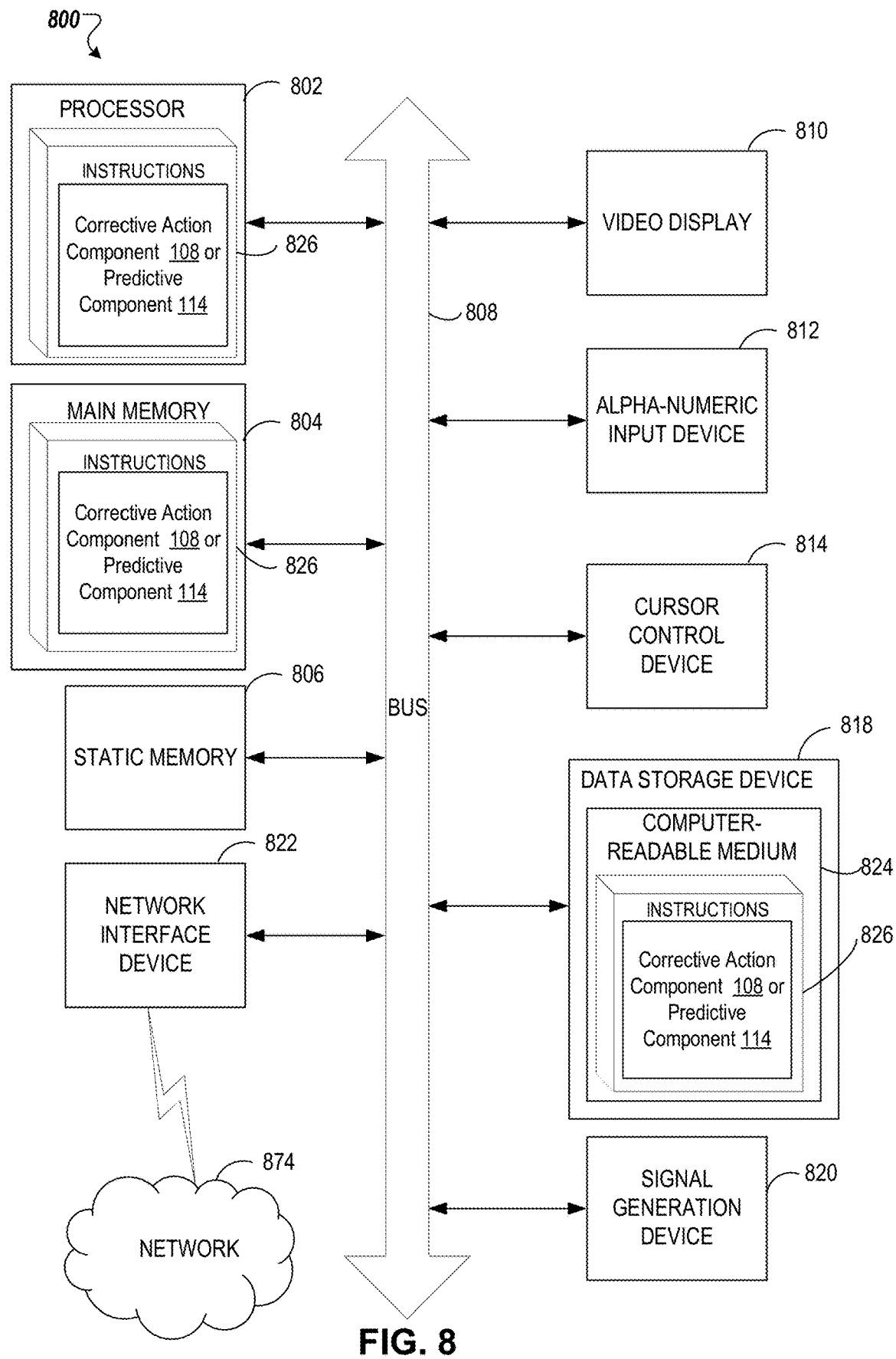
FIG. 8 is a block diagram illustrating a computer system, according to certain embodiments.

FIG. 8 is a block diagram illustrating a computer system 800, according to certain embodiments. In some embodiments, computer system 800 may be connected (e.g., via a network, such as a Local Area Network (LAN), an intranet, an extranet, or the Internet) to other computer systems. Computer system 800 may operate in the capacity of a server or a client computer in a client-server environment, or as a peer computer in a peer-to-peer or distributed network environment. Computer system 800 may be provided by a PC, a tablet PC, a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 800 may include a processing device 802, a volatile memory 804 (e.g., random access memory (RAM)), a non-volatile memory 806 (e.g., read-only memory (ROM) or electrically-erasable programmable ROM (EEPROM)), and a data storage device 816, which may communicate with each other via a bus 808.

Processing device 802 may be provided by one or more processors such as a general purpose processor (such as, for example, a complex instruction set computing (CISC) microprocessor, a reduced instruction set computing (RISC) microprocessor, a very long instruction word (VLIW) microprocessor, a microprocessor implementing other types of instruction sets, or a microprocessor implementing a combination of types of instruction sets) or a specialized processor (such as, for example, an application specific integrated circuit (ASIC), a field programmable gate array (FPGA), a digital signal processor (DSP), or a network processor).

Computer system 800 may further include a network interface device 822. Computer system 800 also may include a video display unit 810 (e.g., a liquid crystal display (LCD)), an alphanumeric input device 812 (e.g., a keyboard), a cursor control device 814 (e.g., a mouse), and a signal generation device 820.

In some implementations, data storage device 816 may include a non-transitory computer-readable storage medium 824 on which may store instructions 826 encoding any one or more of the methods or functions described herein, including instructions encoding components of FIG. 1 (e.g., corrective action component 108, predictive component 114, etc.) and for implementing methods described herein.

Instructions 826 may also reside, completely or partially, within volatile memory 804 and/or within processing device 802 during execution thereof by computer system 800, hence, volatile memory 804 and processing device 802 may also constitute machine-readable storage media.

While computer-readable storage medium 824 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The methods, components, and features described herein may be implemented by discrete hardware components or may be integrated in the functionality of other hardware components such as ASICS, FPGAs, DSPs or similar devices. In addition, the methods, components, and features may be implemented by firmware modules or functional circuitry within hardware devices. Further, the methods, components, and features may be implemented in any combination of hardware devices and computer program components, or in computer programs.

Unless specifically stated otherwise, terms such as "identifying," "receiving," "determining," "predicting," "training," "providing," "obtaining," "extrapolating," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and may not have an ordinal meaning according to their numerical designation.

Examples described herein also relate to an apparatus for performing the methods described herein. This apparatus may be specially constructed for performing the methods described herein, or it may include a general purpose computer system selectively programmed by a computer program stored in the computer system. Such a computer program may be stored in a computer-readable tangible storage medium.

The methods and illustrative examples described herein are not inherently related to any particular computer or other apparatus. Various general purpose systems may be used in accordance with the teachings described herein, or it may prove convenient to construct more specialized apparatus to perform methods described herein and/or each of their individual functions, routines, subroutines, or operations.

Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A method comprising:
   identifying, by a processing device, first structure data of a first region of a substrate;
   receiving, by the processing device, optical metrology data of the substrate associated with one or more substrate deposition processes performed in a processing chamber of substrate processing equipment;
   determining, by the processing device based on the optical metrology data and the first structure data, a first growth rate of the first region of the substrate associated with the one or more substrate deposition processes performed in the processing chamber of the substrate processing equipment;
   determining, by the processing device based on the optical metrology data and the first growth rate, thickness data of a second region of the substrate without second structure data of the second region, wherein the thickness data is determined in a non-destructive manner; and
   causing performance of a corrective action associated with processing one or more substrates via the processing chamber of the substrate processing equipment based on the thickness data of the second region of the substrate.

2. The method of claim 1, wherein the first region is a metrology pad and the second region is a functional region of the substrate.

3. The method of claim 1, wherein the identifying of the first structure data of the first region of the substrate is based on one or more of a reference metrology tool or a physical model of the first region.

4. The method of claim 1, wherein the optical metrology data comprises one or more of:
   scatterometry data;
   reflectometry data;
   spectroscopic data;
   ellipsometry data;
   atomic force microscopy (AFM) data;
   critical-dimension scanning electron microscope (CD-SEM) data; or
   critical-dimension small angle x-ray scattering (CD-SAXS) data.

5. The method of claim 1 further comprising determining, based on the optical metrology data, spatial data of the first region over time, wherein the determining of the first growth rate of the first region is further based on the spatial data of the first region over time.

6. The method of claim 1, wherein the thickness data comprises one or more of:
   onset of growth regime of the one or more substrate deposition processes on the second region;
   region-specific onset of a subsequent atomic layer growth on a layer of similar material in the second region;
   a thickness difference between the first region and the second region; or
   a deposited thickness on the second region responsive to at least a portion of the one or more substrate deposition processes.

7. The method of claim 1 further comprising:
   receiving historical optical metrology data of a plurality of growth cycles over time of the substrate; and
   training a model using data input comprising the historical optical metrology data to generate a trained model, wherein the determining of the thickness data is based on the trained model.

8. The method of claim 1 further comprising:
   providing the optical metrology data as input to a trained model that has been trained using data input comprising historical optical metrology data of a plurality of growth cycles over time of the substrate; and
   obtaining, from the trained model, one or more outputs, wherein the determining of the thickness data is based on the one or more outputs.

9. The method of claim 1, wherein the determining of the thickness data is further based on an aspect ratio associated with the second region.

10. The method of claim 1 further comprising:
    determining, based on the optical metrology data, estimated thickness data of the second region;
    extrapolating the estimated thickness data of the second region to a previous point in time to generate expected data; and
    determining offset data based on a difference between the expected data and measured data of the previous point in time, wherein the determining of the thickness data is further based on the offset data.

11. The method of claim 1, wherein the determining of the thickness data is via one or more of polynomial fit or an empirical model.

12. The method of claim 1, wherein the corrective action is associated with the one or more substrate deposition processes in the processing chamber.

13. A system comprising:
    a memory storing instructions; and
    a processing device coupled to the memory, the processing device to execute the instructions to:
      identify first structure data of a first region of a substrate;
      receive optical metrology data of the substrate associated with one or more substrate deposition processes performed in a processing chamber of substrate processing equipment;
      determine, based on the optical metrology data and the first structure data, a first growth rate of the first region of the substrate associated with the one or more substrate deposition processes performed in the processing chamber of the substrate processing equipment;
      determine, based on the optical metrology data and the first growth rate, thickness data of a second region of the substrate without second structure data of the second region, wherein the thickness data is determined in a non-destructive manner; and
      causing performance of a corrective action associated with processing one or more substrates via the processing chamber of the substrate processing equipment based on the thickness data of the second region of the substrate.

14. The system of claim 13, wherein the processing device is further to determine, based on the optical metrology data, spatial data of the first region over time, wherein the processing device is to determine the first growth rate of the first region further based on the spatial data of the first region over time.

15. The system of claim 13, wherein the processing device is further to:
    determining, based on the optical metrology data, estimated thickness data of the second region;
    extrapolating the estimated thickness data of the second region to a previous point in time to generate expected data; and
    determining offset data based on a difference between the expected data and measured data of the previous point in time, wherein the processing device is to determine the thickness data further based on the offset data.

16. The system of claim 13, wherein the corrective action is associated with the one or more substrate deposition processes in the processing chamber.

17. A non-transitory computer readable medium having instructions stored thereon, which, when executed by a processing device, cause the processing device to perform operations comprising:
    identifying first structure data of a first region of a substrate;
    receiving optical metrology data of the substrate associated with one or more substrate deposition processes performed in a processing chamber of substrate processing equipment;
    determining, based on the optical metrology data and the first structure data, a first growth rate of the first region of the substrate associated with the one or more substrate deposition processes performed in the processing chamber of the substrate processing equipment;
    determining, based on the optical metrology data and the first growth rate, thickness data of a second region of the substrate without second structure data of the second region, wherein the thickness data is determined in a non-destructive manner; and
    causing performance of a corrective action associated with processing one or more substrates via the processing chamber of the substrate processing equipment based on the thickness data of the second region of the substrate.

18. The non-transitory computer readable medium of claim 17, wherein the operations further comprise determining, based on the optical metrology data, spatial data of the first region over time, wherein the determining of the first growth rate of the first region is further based on the spatial data of the first region over time.

19. The non-transitory computer readable medium of claim 17, wherein the operations further comprise:
    determining, based on the optical metrology data, estimated thickness data of the second region;
    extrapolating the estimated thickness data of the second region to a previous point in time to generate expected data; and
    determining offset data based on a difference between the expected data and measured data of the previous point in time, wherein the determining of the thickness data is further based on the offset data.

20. The non-transitory computer readable medium of claim 17, wherein the corrective action is associated with the one or more substrate deposition processes in the processing chamber.

* * * * *